(12) United States Patent
Kim et al.

(10) Patent No.: US 7,153,740 B2
(45) Date of Patent: Dec. 26, 2006

(54) FABRICATION OF LEAN-FREE STACKED CAPACITORS

(75) Inventors: Dae-Hwan Kim, Hwasung (KR); Min Heo, Suwon (KR); Dong-Won Shin, Seongnam (KR); Byeong-Hyeon Lee, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 246 days.

(21) Appl. No.: 10/853,628

(22) Filed: May 25, 2004

(65) Prior Publication Data

US 2005/0176210 A1    Aug. 11, 2005

(30) Foreign Application Priority Data

Feb. 10, 2004    (KR) ............... 10-2004-0008770

(51) Int. Cl.
*H01L 21/8242* (2006.01)

(52) U.S. Cl. ............... 438/253; 438/254; 438/255; 438/256; 257/E21.396

(58) Field of Classification Search ............... 438/689, 438/253

See application file for complete search history.

(56) References Cited

U.S. PATENT DOCUMENTS

| | | | |
|---|---|---|---|
| 6,500,763 B1 * | 12/2002 | Kim et al. ............... 438/689 |
| 2001/0005631 A1 | 6/2001 | Kim et al. |
| 2003/0085420 A1 | 5/2003 | Ito et al. |
| 2003/0136996 A1 | 7/2003 | Park |
| 2003/0224571 A1 | 12/2003 | Iijima et al. |

\* cited by examiner

*Primary Examiner*—Walter Lindsay, Jr.
*Assistant Examiner*—Elias Ullah
(74) *Attorney, Agent, or Firm*—Monica H. Choi

(57) ABSTRACT

For fabricating lean-free stacked capacitors, openings are formed through layers of materials including a layer of support material displaced from a bottom of the openings. A respective first electrode is formed for a respective capacitor within each of the openings. The layer of support material is patterned to form support structures around the first electrodes. Masking spacers are formed around exposed top portions of the first electrodes, and exposed portions of the support material are etched away to form the support structures. Such stacked capacitors are applied within a DRAM (dynamic random access memory).

25 Claims, 25 Drawing Sheets

FABRICATION OF LEAN-FREE STACKED CAPACITORS

CROSS-REFERENCE TO RELATED APPLICATION(S)

The present application claims priority under 35 U.S.C. §119 to Korean Patent Application No. P2004-8770, filed on Feb. 10, 2004, which is incorporated herein by reference in its entirety.

TECHNICAL FIELD

The present invention relates generally to integrated circuit fabrication, and more particularly, to fabrication of lean-free stacked capacitors that may be used for DRAM (dynamic random access memory).

BACKGROUND OF THE INVENTION

FIG. 1 shows a simplified schematic of a DRAM (dynamic random access memory) cell 100 including a switching transistor 102 and a storage capacitor 104. A DRAM includes an array of such DRAM cells. When the switching transistor 102 is an NMOSFET (N-channel metal oxide semiconductor field effect transistor), the gate of the NMOSFET 102 is coupled to a word-line 106 of the DRAM, and the drain of the NMOSFET 102 is coupled to a bit-line 108 of the DRAM.

In a typical DRAM array, the DRAM cells along a same column are coupled to a same bit-line, and the DRAM cells along a same row are coupled to a same word-line. The source of the NMOSFET 102 is coupled to a storage node of the storage capacitor 104. The other node of the storage capacitor 104 is coupled to a ground node. The bit-line 108 is coupled to a sense amplifier 110.

The voltage across the storage capacitor 104 determines the logical level "1" or "0" stored within the DRAM cell 100. The sense amplifier 110 outputs such a stored logical level at the storage node of the storage capacitor 104. A parasitic capacitance 112, at the bit-line 108, disadvantageously deteriorates the voltage signal, Vsignal, to the sense amplifier 110 since Vsignal is directly proportional to Cs/Cp, with Cs being the capacitance of the storage capacitor 104 and Cp being the capacitance of the parasitic capacitor 112.

The capacitance, Cs, of the storage capacitor 104 is desired to be maximized to provide sufficient voltage signal, Vsignal, to the sense amplifier 110 and for enhancing retention time for the DRAM cell 100. On the other-hand, the area occupied by the DRAM cell 100 is also desired to be minimized. Thus, a stacked capacitor having electrodes formed vertically upwards is used for the storage capacitor 104 of the DRAM cell 100.

Capacitance of a capacitor formed with two electrodes is generally expressed as follows:

$$C = A\epsilon/d$$

C is the capacitance of the capacitor, and A is an area of overlap between the two electrodes. In addition, $\epsilon$ is the dielectric constant of the dielectric between the two electrodes, and d is the thickness of such a dielectric.

FIG. 2 illustrates a cross-sectional view of a first stacked capacitor 112 and a second stacked capacitor 114. The first stacked capacitor 112 includes a first electrode 116 coupled, via a conductive plug structure 118, to a junction of a switching transistor (not shown for clarity of illustrate in FIG. 2) for a first DRAM cell formed with a semiconductor substrate 120. Similarly, the second stacked capacitor 114 includes a first electrode 122 coupled, via a conductive plug structure 124, to a junction of a switching transistor (not shown for clarity of illustrate in FIG. 2) for a second DRAM cell formed with the semiconductor substrate 120.

A layer of support dielectric 126 surrounds the first electrodes 116 and 122 toward the bottom of such electrodes 116 and 122. A capacitor dielectric 128 is formed on exposed surfaces after formation of the first electrodes 116 and 122 and the support dielectric 126. A second electrode 130 is formed onto the capacitor dielectric 128, and the second electrode 130 is typically coupled to the ground node of the storage capacitor 104 as illustrated in FIG. 1. ILD (inter-level dielectric) layers 132 and 134 are formed to electrically isolate the conductive structures in FIG. 2.

For maximizing capacitance of the stacked capacitors 112 and 114, the area of overlap between the first and second electrodes is desired to be maximized. Thus, the height of the first and second electrodes is desired to be maximized. However, with ever-increasing height, the adjacent first electrodes 116 and 122 that are exposed during fabrication may lean towards each-other with the support dielectric 126 being disposed just toward the bottom of the electrodes 116 and 122.

In addition, the area occupied by the DRAM is desired to be further minimized with advancement of IC (integrated circuit) fabrication technology. Thus, the first electrodes 116 and 122 are desired to be disposed closer together. Such exposed and leaning electrodes 116 and 122 when disposed close enough together may disadvantageously contact each-other during fabrication resulting in malfunction of the DRAM.

Referring to FIG. 3, U.S. Patent Application Publication No. U.S. 2003/0085420 to Ito et al. discloses stacked capacitors 142 and 144 with support beams 146 disposed above the layer of support dielectric 126 for preventing leaning of the first electrodes 116 and 122. FIG. 4 shows a cross-sectional view across line A—A of FIG. 3 through the support beams 146. Elements having the same reference number in FIGS. 2, 3, 4, 5, 6, and 7 refer to elements having similar structure and function.

Referring to FIGS. 3 and 4, support beams 146 are formed on the four sides of a first electrode 116. In addition, each support beam 146 is disposed between two adjacent first electrodes 116 and 122, well above the bottom support dielectric 126. Thus, the support beams 146 prevent the exposed top portions of two adjacent first electrodes 116 and 122 from leaning against each other during fabrication of the stacked capacitors 142 and 144.

FIGS. 5, 6, and 7 illustrate cross-sectional views across line A—A of FIG. 3 during fabrication of the support beams 146. Referring to FIG. 5, a material comprising the support beams 146 is first patterned on a sacrificial dielectric material 148. Referring to FIGS. 5 and 6, openings 150, 152, 154, and 156 are each formed around an intersection point of the support beams 146. Referring to FIG. 7, a respective first electrode is formed at the walls of each of the openings 150, 152, 154, and 156. FIG. 7 shows the example first electrodes 116 and 122. Thereafter, the sacrificial dielectric material 148 is etched away, and the gate electric 128 and the second electrode 130 are formed onto exposed surfaces of the first electrodes and the support beams 146.

With such a prior art process, the support beams 146 are formed before the stacked capacitors are formed within the openings 150, 152, 154, and 156. With such early formation of the support beams 146, subsequent etching steps may decrease the width (w) and the thickness of the support beams 146. Thus, the width and the thickness of the support beams 146 are more difficult to control in the prior art.

SUMMARY OF THE INVENTION

Accordingly, in a general aspect of the present invention, support structures for preventing leaning of adjacent first electrodes of stacked capacitors are formed after formation of the first electrodes.

In an embodiment of the present invention, openings are formed through layers of materials including a layer of support material displaced from a bottom of the openings. A respective first electrode is formed for a respective capacitor within each of the openings. The layer of support material is patterned to form support structures around the first electrodes, after formation of the first electrodes within the openings.

In an example embodiment for forming the support structures, at least one of the layers of materials toward the top of the first electrodes is etched away such that a top portion of the first electrodes is exposed and such that the support material is exposed. Masking spacers are formed with a masking material around the exposed top portions of the first electrodes. A mask structure of the masking material remains on joining portions of the support material. Exposed portions of the support material are etched away such that the support structures including the joining portions are formed from the remaining support material. Each joining portion is disposed between the first electrodes of adjacent capacitors.

Further for such an example embodiment, the masking material is deposited with a thickness that is greater than ½ of a length of the joining portions, before forming the masking spacers. Additionally for such an example embodiment, the support structures include a respective disc that may be a circular disc surrounding each first electrode. Also for such an example embodiment, the respective disc surrounding each first electrode is further etched such that a respective beam remains for each of the joining portions as the support structures.

In yet another embodiment of the present invention, a layer of mount material is formed to surround the openings toward the bottom of the openings. In that case, the support structures are disposed between the mount material and the top of the first electrodes.

For further forming the capacitors, the layers of materials are etched away except for the support structures, the mount material, and the first electrodes. A capacitor dielectric is formed on exposed surfaces of such remaining structures, and a second electrode is formed on the capacitor dielectric.

In another embodiment of the present invention, the openings are formed through a plurality of mold layers, with a respective etch rate of each mold layer successively increasing toward a bottom of the openings. Thus, the openings are not substantially narrow toward the bottom of the openings.

Such stacked capacitors may be advantageously applied to form a capacitor array for a DRAM (dynamic random access memory). In that case, each of the openings is formed onto a respective conductive plug coupled to a junction of a respective switching transistor, and the first electrode is a storage node for each capacitor.

In this manner, the support structures for preventing leaning of the first electrodes of the stacked capacitors are formed after the first electrodes are fabricated within the openings. Thus, less subsequent etching steps do not deteriorate the structural integrity of the support structures. In addition, because the first electrodes are available for forming the support structures, masking spacers are formed using the first electrodes for easily patterning the support structures around the first electrodes.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1–32 refer to elements having similar structure and function.

DETAILED DESCRIPTION

Figure 8:
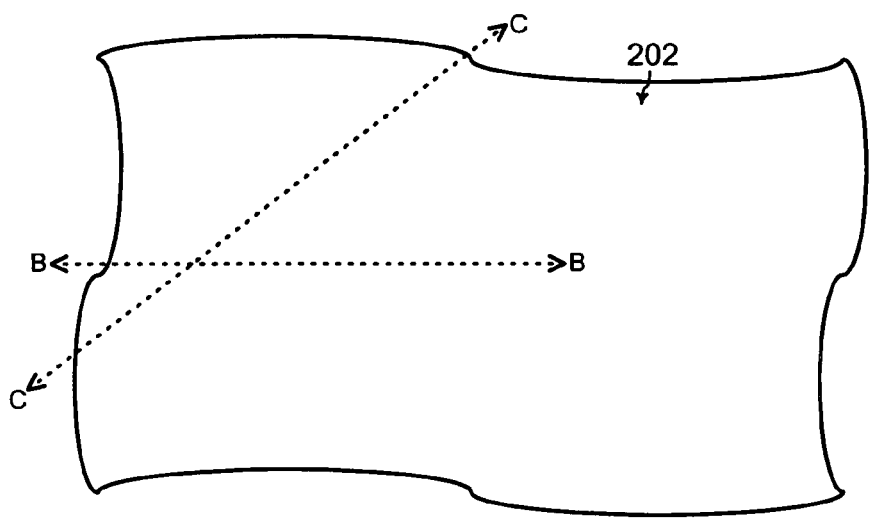
FIG. 8 shows two directions, B—B and C—C, across a top view of a semiconductor substrate for illustrating cross-sectional views of stacked capacitors formed across such directions, according to an embodiment of the present invention.

Referring to FIG. 8, a DRAM (dynamic random access memory) is fabricated onto a semiconductor substrate 202, comprised of a silicon wafer for example. FIGS. 9A, 10A, 11A, 12A, 13A, 14A, 15A, 16A, 18A, 19A, 20A, 21A, and 23A show cross-sectional views along a B—B direction of FIG. 8 for fabrication of stacked capacitors, according to an embodiment of the present invention. FIGS. 9B, 10B, 11B, 12B, 13B, 14B, 15B, 16B, 18B, 19B, 20B, 21B, and 23B show cross-sectional views along a C—C direction of FIG. 8 for fabrication of stacked capacitors, according to an embodiment of the present invention.

In an example embodiment of the present invention, the stacked capacitors are part of the DRAM fabricated on the semiconductor substrate 202. The B—B direction of FIG. 8 crosses through a plurality of word-lines of such a DRAM, and the C—C direction of FIG. 8 crosses through a plurality of bit-lines of such a DRAM.

Figure 9A:
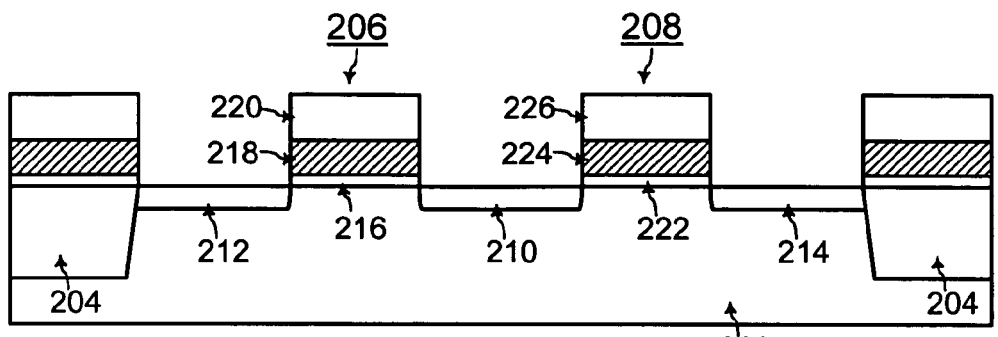
FIGS. 9A, 10A, 11A, 12A, 13A, 14A, 15A, 16A, 18A, 19A, 20A, 21A, and 23A show cross-sectional views along the B—B direction of FIG. 8 for illustrating fabrication of stacked capacitors, according to an embodiment of the present invention.
Figure 9B:
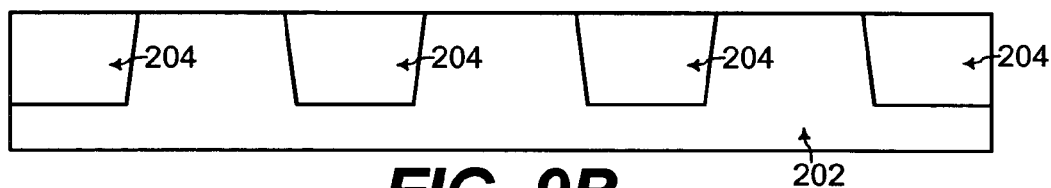
FIGS. 9B, 10B, 11B, 12B, 13B, 14B, 15B, 16B, 18B, 19B, 20B, 21B, and 23B show cross-sectional views along the C—C direction of FIG. 8 for illustrating fabrication of stacked capacitors, according to an embodiment of the present invention.

Referring to FIGS. 9A and 9B, a plurality of STI (shallow trench isolation) structures 204 are formed into the semiconductor substrate 202. The STI structures 204 are comprised of a dielectric material such as silicon dioxide ($SiO_2$) in an embodiment of the present invention. Referring to FIG. 9A, a first switching transistor 206 and a second switching transistor 208 are formed in an active device area of the semiconductor substrate 202 between the STI structures 204.

Further referring to FIG. 9A, the first and second switching transistors 206 and 208 share a drain junction 210. Additionally, a first source junction 212 is formed for the first switching transistor 206, and a second source junction 214 is formed for the second switching transistor 208. Such junctions 210, 212, and 214 are doped with an N-type dopant for forming an NMOSFET (N-channel metal oxide semiconductor field effect transistor) for each of the first and second switching transistors 206 and 208, in an example embodiment of the present invention.

A first gate stack, comprised of a first gate dielectric 216, a first gate structure 218, and a first gate mask 220, is formed for the first NMOSFET 206. In addition, a second gate stack, comprised of a second gate dielectric 222, a second gate structure 224, and a second gate mask 226, is formed for the second NMOSFET 208. A repeating pattern of such gate stacks are formed across the semiconductor substrate 202 such that such gate stacks are also formed onto the STI structures 204 in FIG. 9A.

In an example embodiment of the present invention, the gate dielectrics 216 and 222 are comprised of silicon dioxide ($SiO_2$), the gate structures 218 and 224 are comprised of polysilicon, and the gate masks 220 and 226 are comprised of silicon nitride (SiN). Each of the gate structures 218 and 224 forms a word-line across a row of DRAM cells. Referring to FIG. 9B, the STI structures 204 are formed across the C—C direction of FIG. 8 after the formation of the NMOSFETs 206 and 208 in FIG. 9A.

Figure 10A:
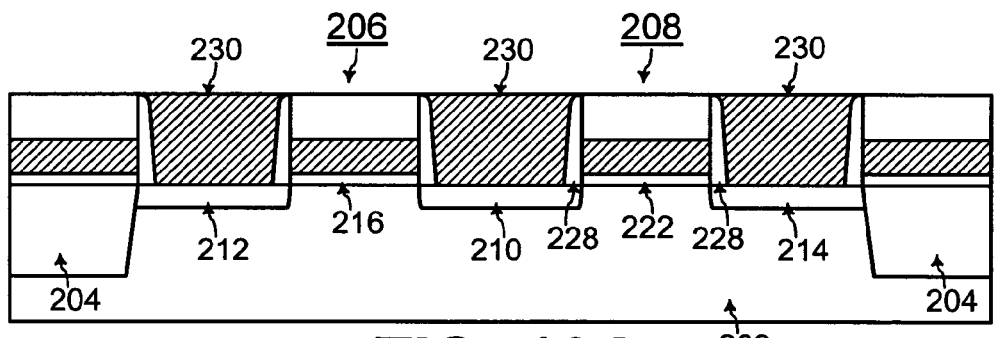
Figure 10B:
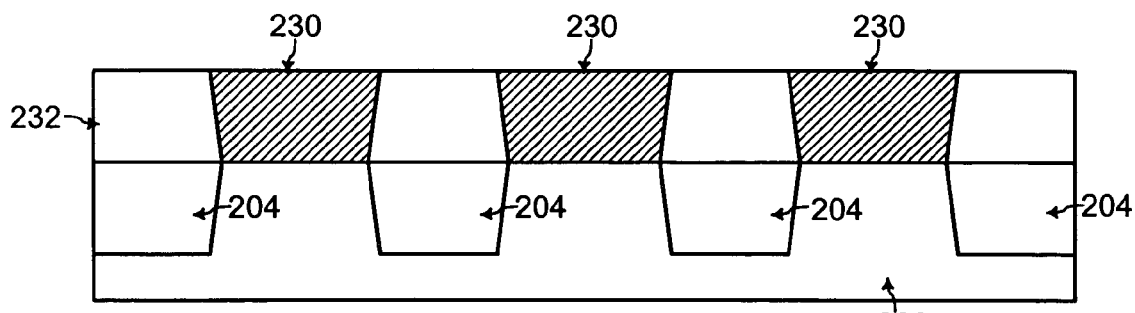

Referring to FIG. 10A, spacer structures 228 are formed onto sidewalls of each of the gate stacks. Such spacer structures 228 are comprised of a dielectric material such as silicon dioxide ($SiO_2$) in an example embodiment of the present invention. Thereafter, first conductive plugs 230 are formed from a SAC (self aligned contact) process with the exposed junctions 210, 212, and 214. Similarly, referring to FIG. 10B, the first conductive plugs 230 are also formed across the C—C direction of FIG. 8 from such a SAC process with exposed regions of the semiconductor substrate 202.

A first ILD (inter-level dielectric) layer 232 surrounds the first conductive plugs 230 in FIG. 9B. The first ILD layer 232 is comprised of a dielectric material such as BPSG (borophosphosilicate glass) in an example embodiment of the present invention. The first conductive plugs 230 are comprised of polysilicon in an example embodiment of the present invention.

Figure 11A:
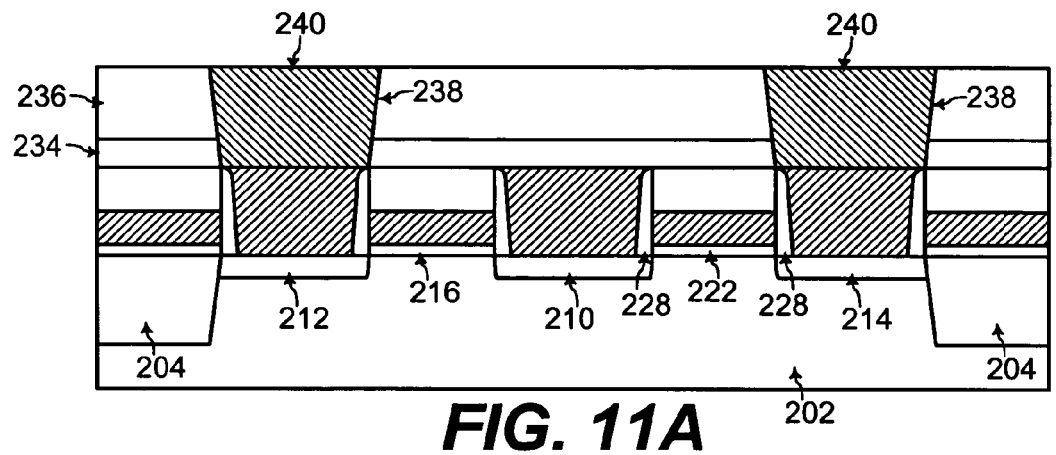

Referring to FIG. 11A after FIG. 10A, a second ILD (inter-level dielectric) layer 234 and a third ILD (inter-level dielectric) layer 236 are deposited. The second ILD layer 234 is comprised of BPSG (borophosphosilicate glass), and the third ILD layer 236 is comprised of a dielectric material such as PSG (phosphosilicate glass) formed from a HDP (high density plasma) deposition process, in an example embodiment of the present invention. Openings 238 are formed through the second and third ILD layers 234 and 236 over the first conductive plugs 230 disposed above the source junctions 212 and 214. Second conductive plugs 240 are formed within the openings 238 and over the first conductive plugs 230.

Figure 11B:
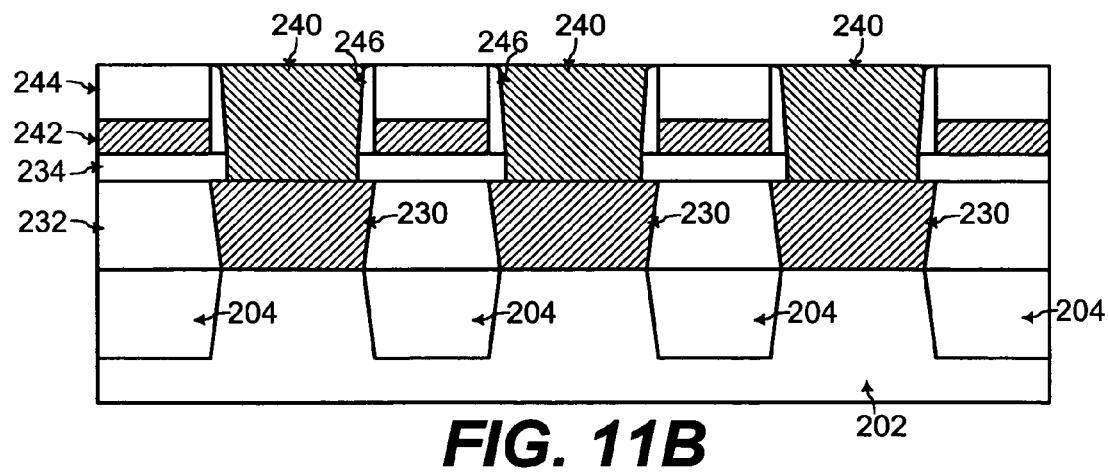

Referring to FIG. 11B, a plurality of bit-line stacks, each comprised of a bit-line 242 and a bit-line mask 244, are patterned on the second ILD layer 234. Spacer structures 246 are formed at the sidewalls of the bit-line stacks. There-after, the second conductive plugs 240 are formed over the first conductive plugs 230. The bit-lines 242 are comprised of tungsten (W), and the bit-line masks 244 are comprised of silicon nitride (SiN), in an example embodiment of the present invention. In addition, the second conductive plugs 240 are comprised of polysilicon, in an example embodiment of the present invention. Further referring to FIGS. 11A and 11B, each of the bit lines 242 is coupled to the drain junctions for a column of DRAM cells.

Figure 12A:
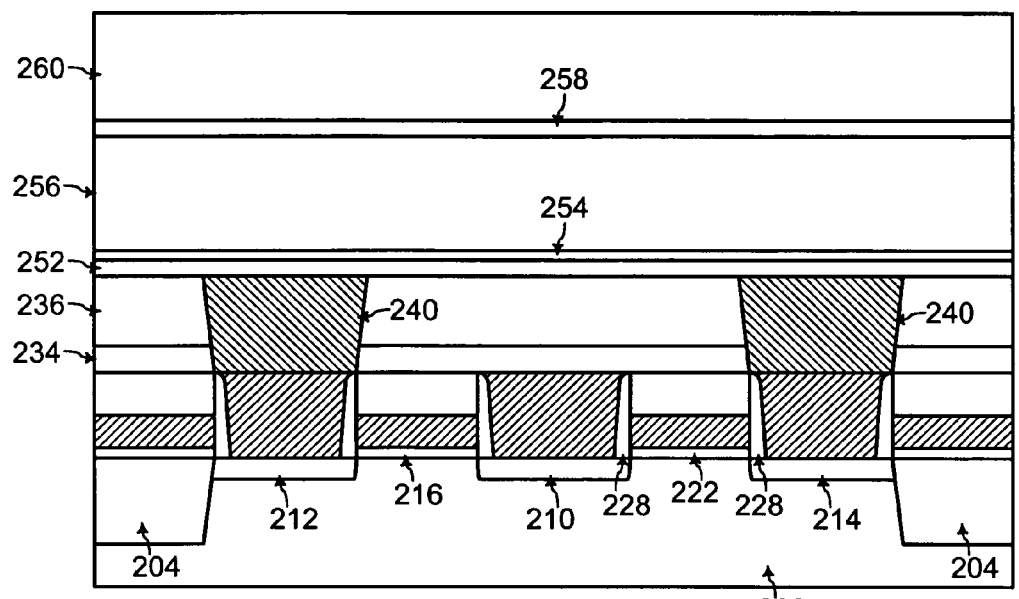
Figure 12B:
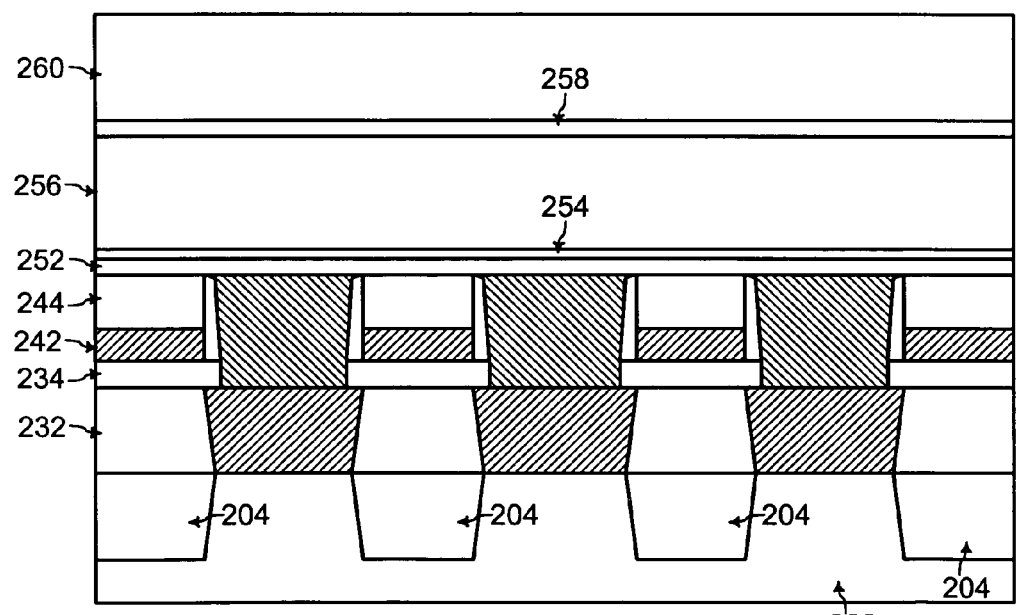

Referring to FIGS. 12A and 12B after FIGS. 11A and 11B, a fourth ILD (inter-level dielectric) layer 252 is deposited onto exposed surfaces of the third ILD layer 236, the second conductive plugs 240, and the bit-lines masks 244. The fourth ILD layer 252 is comprised of PTEOS (phosphorous doped tetraethylorthosilicate) based oxide, in an example embodiment of the present invention.

In addition, a fifth ILD (inter-level dielectric) layer 254 is deposited onto the fourth ILD layer 252. The fifth ILD layer 254 is comprised of silicon nitride (SiN), in an example embodiment of the present invention. Thereafter, a first mold layer 256 is deposited onto the fifth ILD layer 254. The first mold layer 256 is comprised of BPSG (borophosphosilicate glass) or a PTEOS (phosphorous doped tetraethylorthosilicate) based oxide, in an example embodiment of the present invention.

Furthermore, a layer of support material 258 is deposited onto the first mold layer 256. The layer of support material 258 is comprised of silicon nitride (SiN), in an example embodiment of the present invention. Thereafter, a second mold layer 260 is deposited onto the layer of support material 258. The second mold layer 260 is comprised of PTEOS (phosphorous doped tetraethylorthosilicate) based oxide, in an example embodiment of the present invention.

Figure 13A:
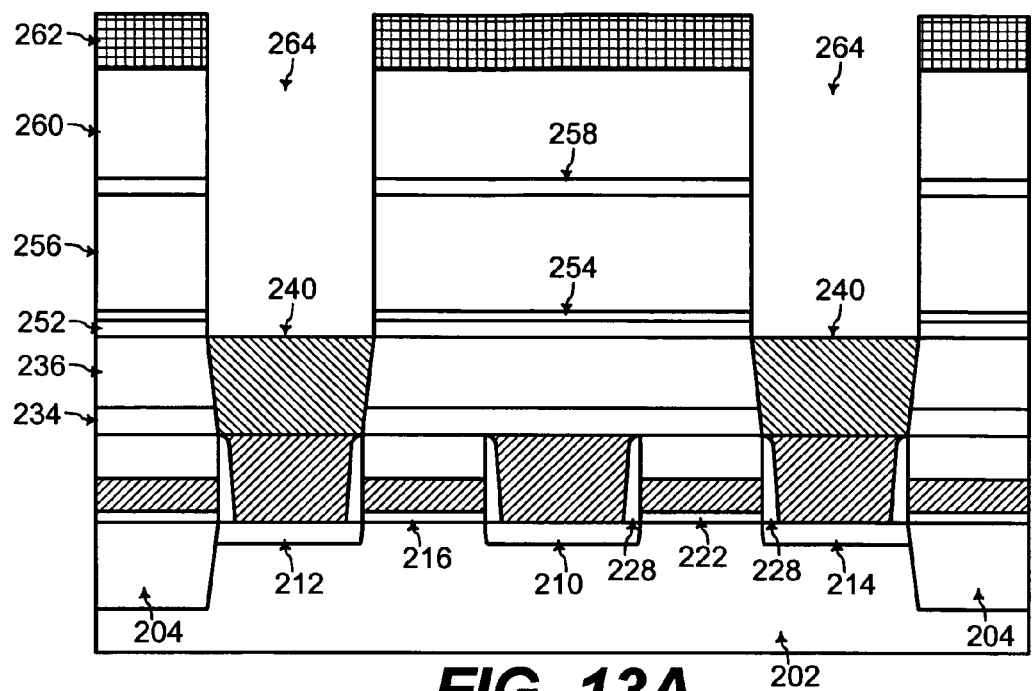
Figure 13B:
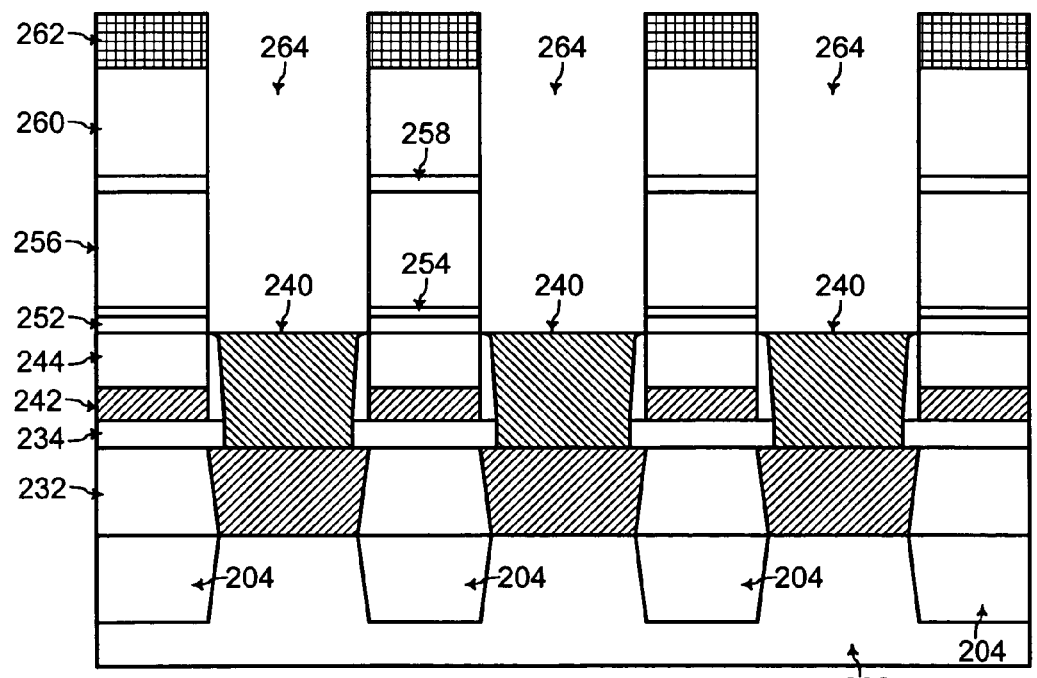

Referring to FIGS. 13A and 13B after FIGS. 12A and 12B, a photo-resist layer 262 is patterned for forming a plurality of openings 264 through the layers of materials 252, 254, 256, 258, and 260. The photo-resist layer 262 is deposited and patterned on the second mold layer 260. Each of the openings 264 is formed over one of the second conductive plugs 240 that are exposed through the openings 264.

Figure 14A:
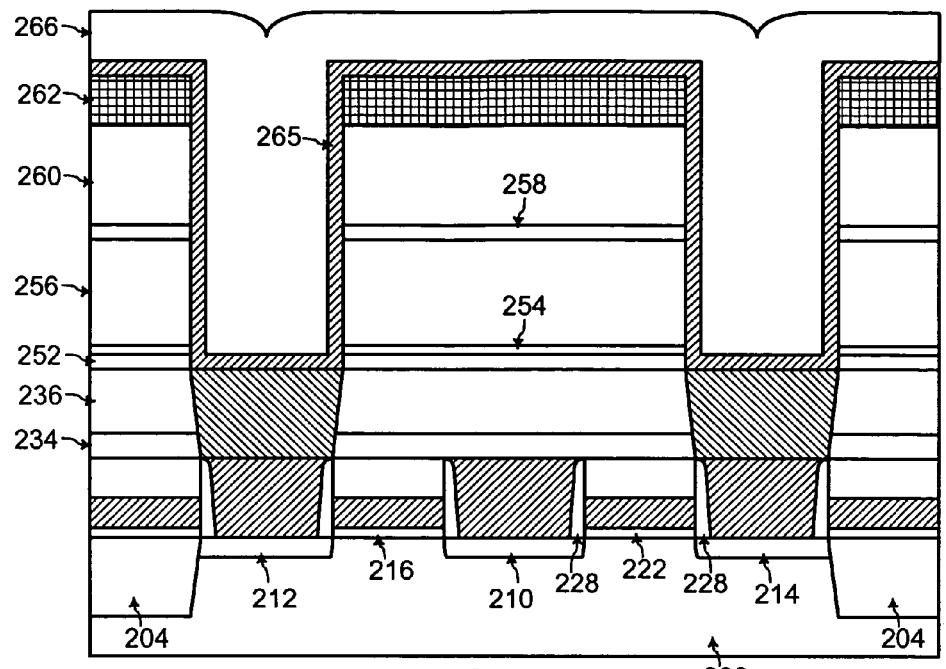
Figure 14B:
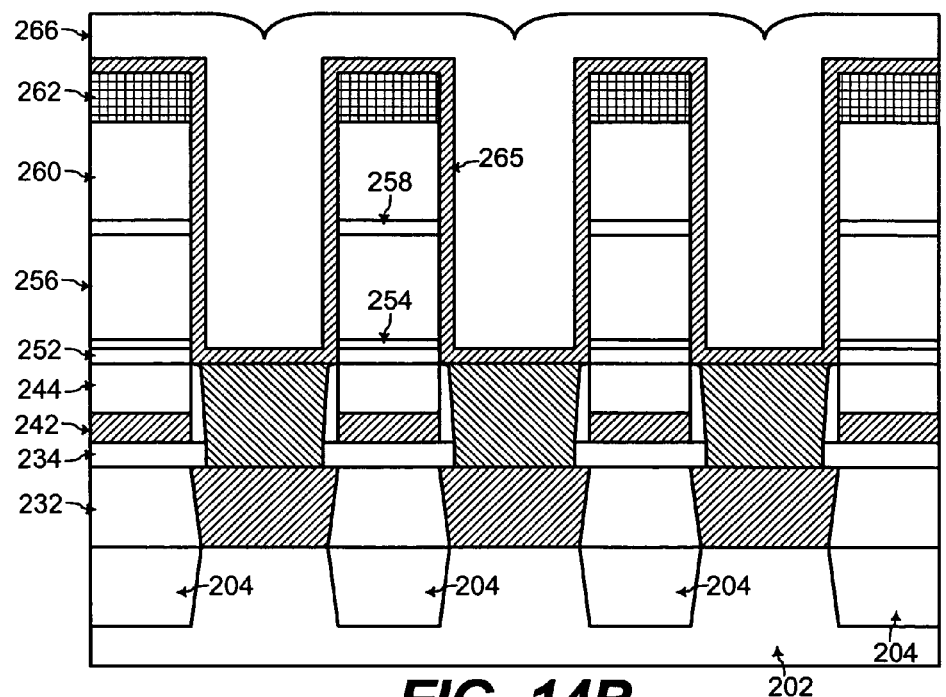

Referring to FIGS. 14A and 14B after FIGS. 13A and 13B, a layer of first electrode material 265 is deposited onto exposed surfaces including any sidewall and bottom wall of the openings 264. The layer of first electrode material 265 is comprised of polysilicon in an example embodiment of the present invention. Thereafter, a sacrificial dielectric material 266 is blanket deposited to fill the openings 264. The sacrificial dielectric material 266 is comprised of USG (un-doped silica glass), in an example embodiment of the present invention.

Figure 15A:
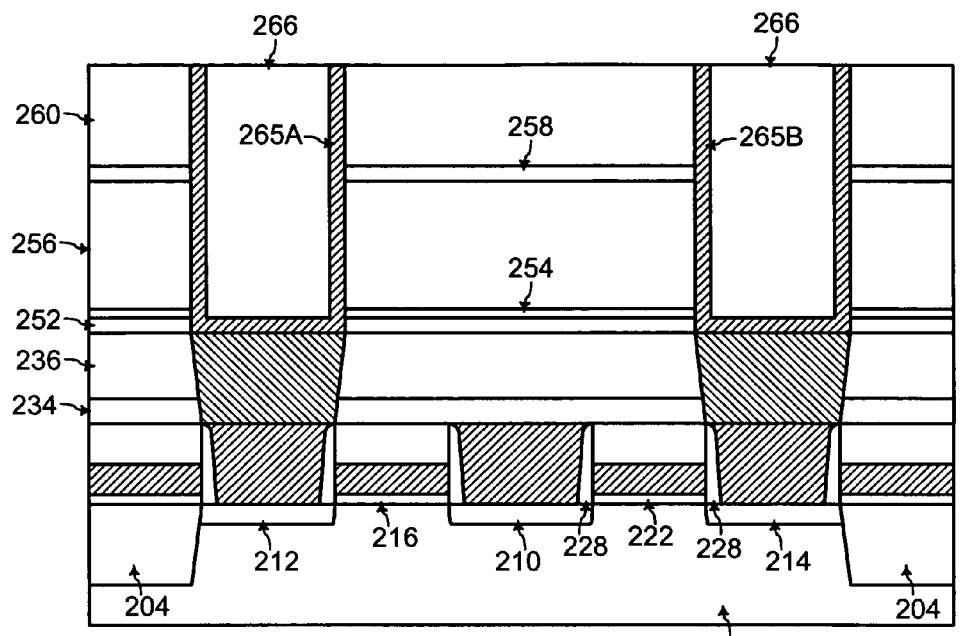
Figure 15B:
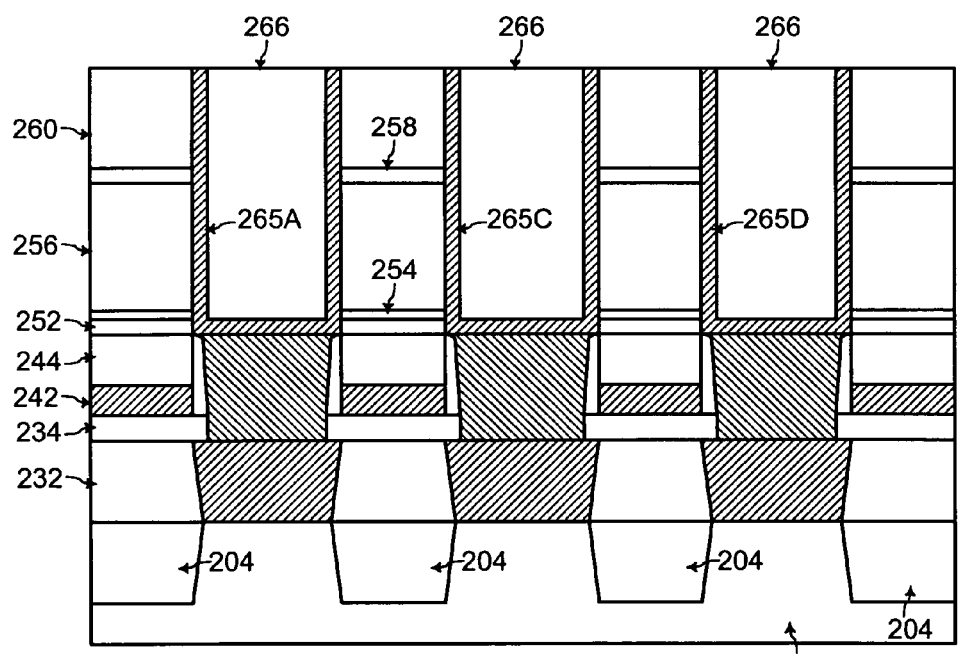

Referring to FIGS. 15A and 15B after FIGS. 14A and 14B, the sacrificial dielectric material 266, the first electrode material 265, and the photo-resist layer 262 are polished down by a CMP (chemical mechanical polishing) process until the first mold layer 260 is exposed. In this manner, the first electrode material 265 becomes separated within each of the openings 264 to form a respective first electrode 265A, 265B, 265C, and 265D within each of the openings 264.

Figure 16A:
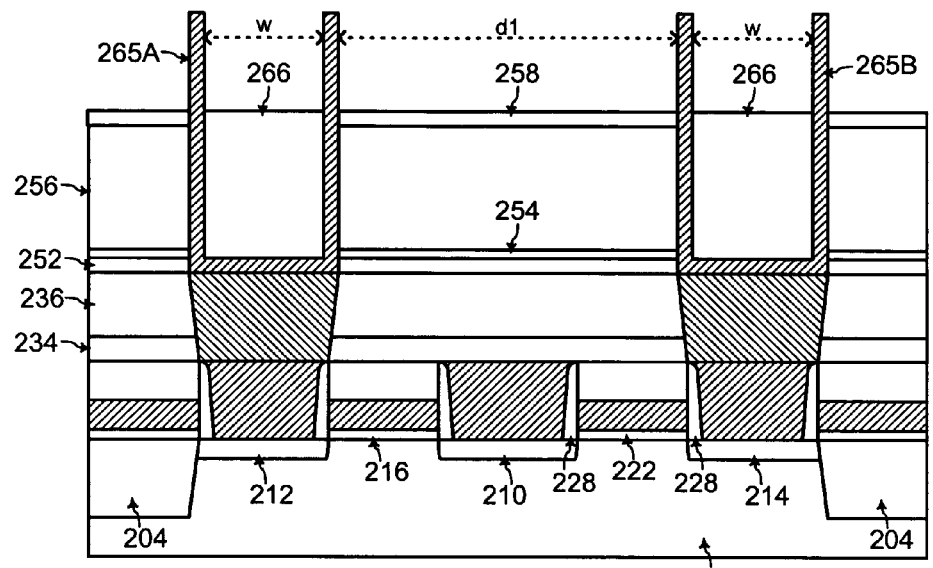
Figure 16B:
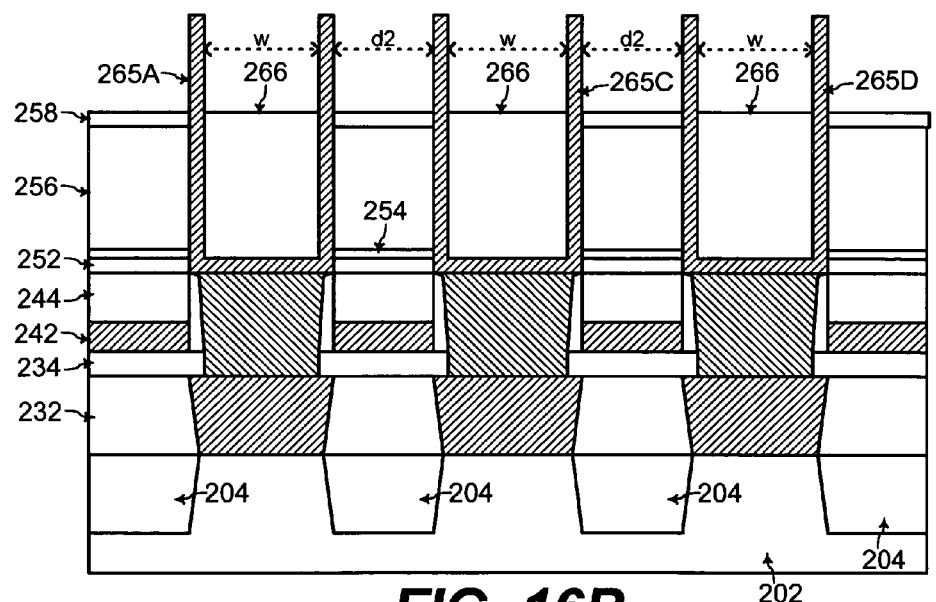

Referring to FIGS. 16A and 16B after FIGS. 15A and 15B, the second mold layer 260 is etched away until the support material 258 is exposed as an etch-stop layer. In addition, a top portion of the sacrificial dielectric 266 within the openings 264 is etched away substantially to the layer of the support material 258, in an example embodiment of the present invention. However, the present invention may also be practiced when the sacrificial dielectric 266 within the openings 264 is not etched away or is etched away to any level.

Figure 17:
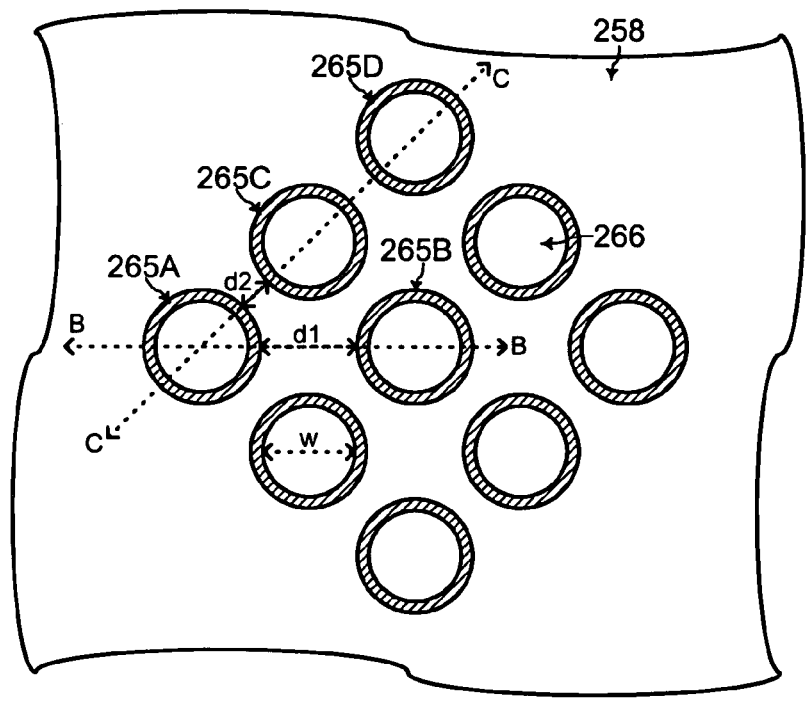
FIG. 17 shows a top view of first electrodes of the stacked capacitors formed after FIGS. 16A and 16B, according to an embodiment of the present invention.

In this manner, a top portion of the first electrodes 265A, 265B, 265C, and 265D is exposed. FIG. 17 shows a top view of the first electrodes 265A, 265B, 265C, and 265D in FIGS. 16A and 16B. Referring to FIG. 17, the first electrodes 265A, 265B, 265C, and 265D are formed as part of an array of such electrodes for a DRAM. FIG. 17 illustrates just an array of 3×3 first electrodes for forming an array of 3×3 stacked capacitors, for simplicity and clarity of illustration. However, a typical DRAM is formed with an array of more numerous stacked capacitors.

Further referring to FIGS. 16A, 16B, and 17, the first electrodes 265A, 265B, 265C, and 265D are formed as circular cylinders in an example embodiment of the present invention. However, the present invention may be practiced for other types of shapes of the first electrodes 265A, 265B, 265C, and 265D. Each such circular first electrode has a diameter "w". Any two adjacent first electrodes (such as 265A and 265B for example) in the B—B direction are separated by a distance of "d1", and any two adjacent first electrodes (such as 265A and 265C for example) in the C—C direction are separated by a distance of "d2".

Figure 18A:
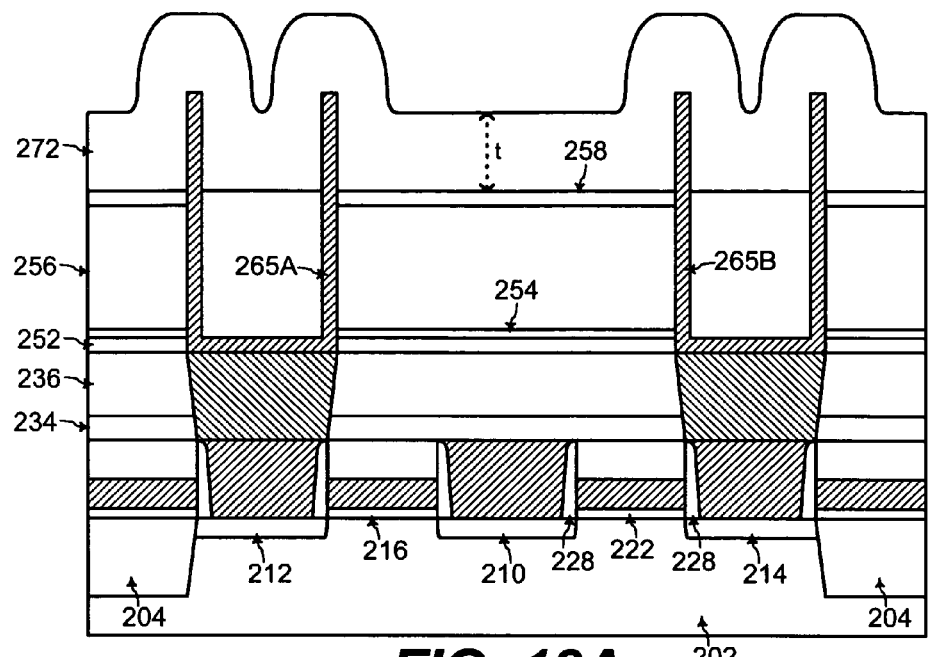
Figure 18B:
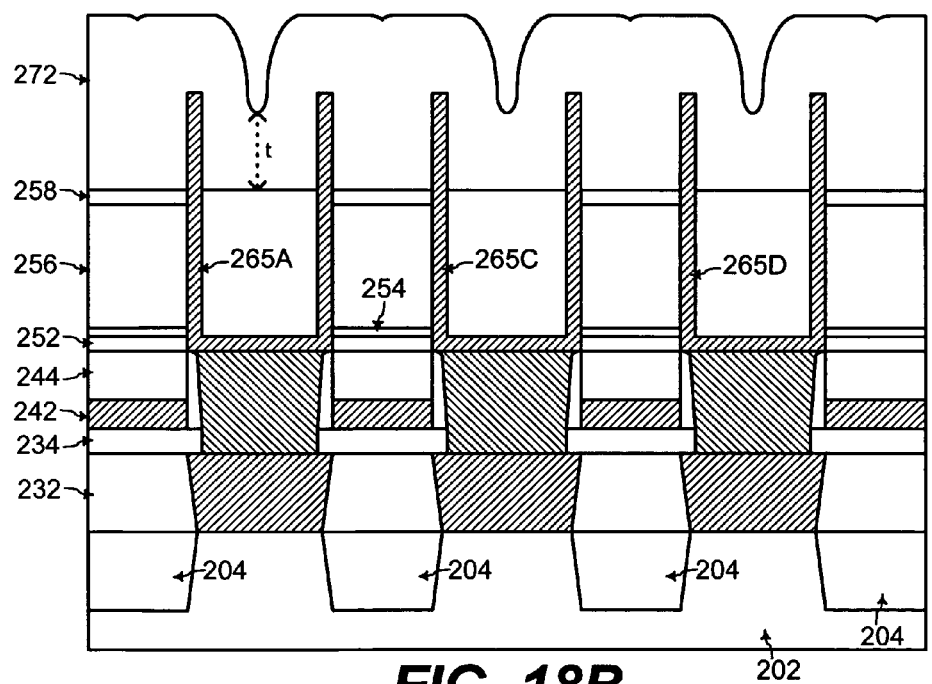

Referring to FIGS. 18A and 18B after FIGS. 16A and 16B, a layer of mask material 272 is blanket deposited onto exposed surfaces of the first electrodes 265A, 265B, 265C, and 265D, the support material 258, and the sacrificial material 266. The layer of mask material 272 is comprised of PTEOS (phosphorous doped tetraethylorthosilicate) based oxide, whereas the support material 258 is comprised of silicon nitride (SiN), in an example embodiment of the present invention. In addition, referring to FIGS. 16A, 16B, 18A, and 18B, the layer of mask material 272 has a thickness "t" that is greater than $(\frac{1}{2})*d2$, in an example embodiment of the present invention.

Figure 19A:
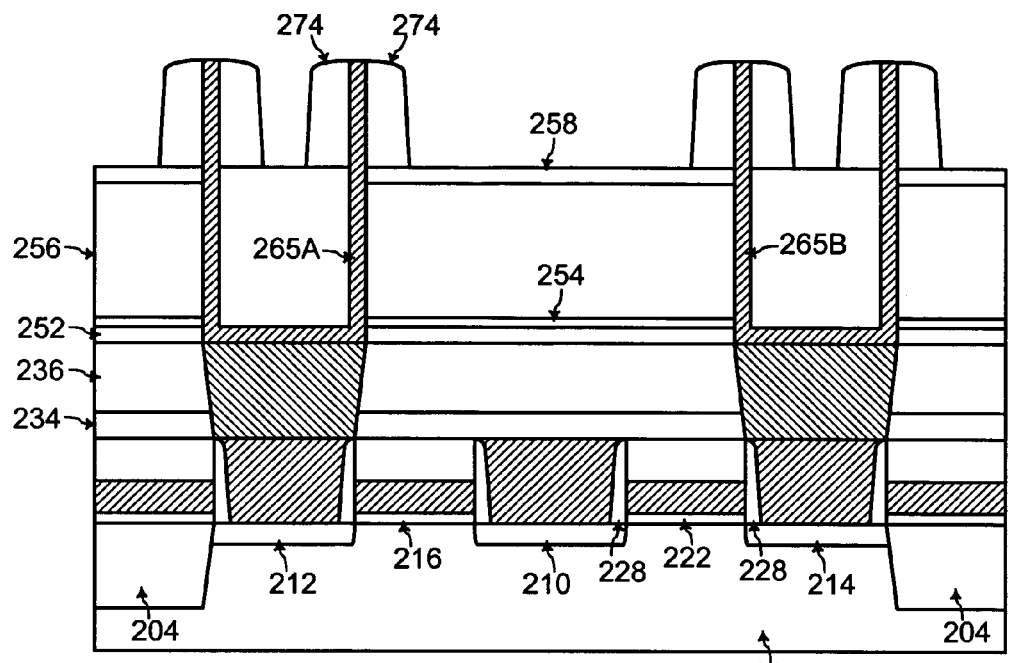
Figure 19B:
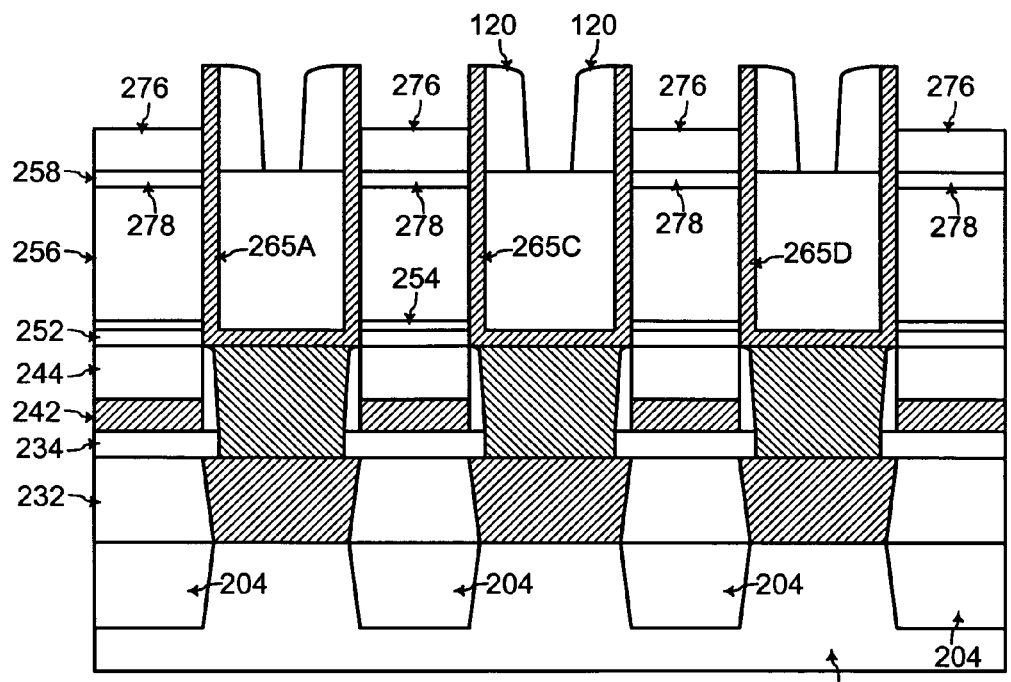

Referring to FIGS. 19A and 19B after FIGS. 18A and 18B, the mask material 272 is etched back to form masking spacers 274 around each of the exposed top portions of the first electrodes 265A and 265B in the B—B direction of FIG. 19A, and within the first electrodes 265A, 265C, and 265D in the C—C direction of FIG. 19B. Further referring to FIG. 19B, mask structures 276, comprised of the masking material 272, remain to cover joining portions 278 of the support material 258 along the d2 distance. Such mask structures 276 are formed because the layer of mask material 272 was deposited with a thickness "t" that is greater than $(\frac{1}{2})*d2$ in FIGS. 18A and 18B.

Further referring to FIGS. 19A and 19B, the support material 258 remains during etch back of the mask material 272 because the mask material 272 has a different etch rate from the support material 258 during the etch back process for forming the masking spacers 274 and the mask structures 276. Thus, referring to FIGS. 20A and 20B, another etch process is used to etch away any exposed portion of the support material 258 that is not covered under the masking spacers 274 or the mask structures 276. In this manner, support structures comprised of the remaining support material 258 are formed around the first electrodes 265A, 265B, 265C, and 265D.

Figure 20A:
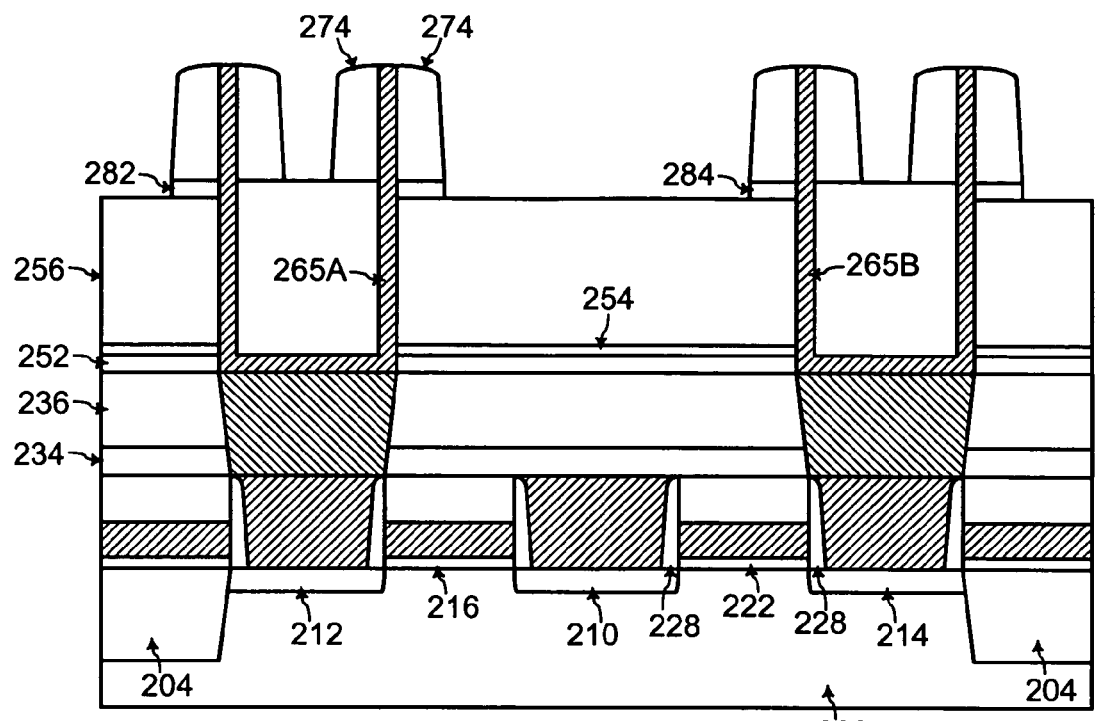
Figure 20B:
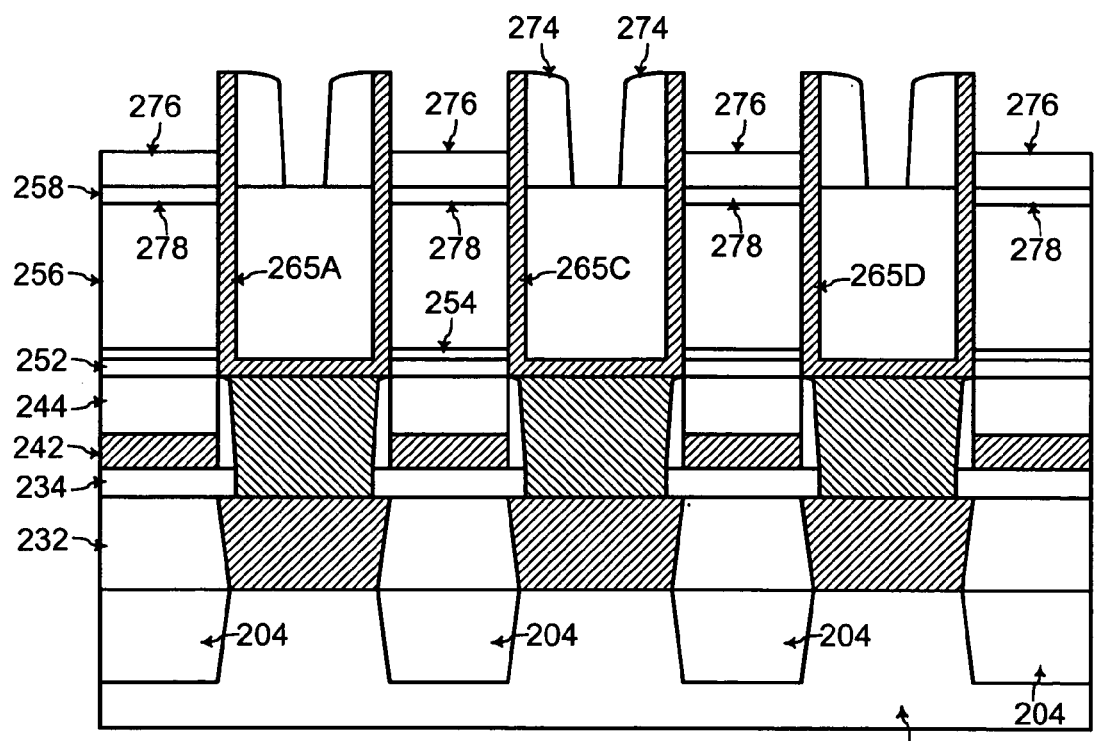
Figure 21A:
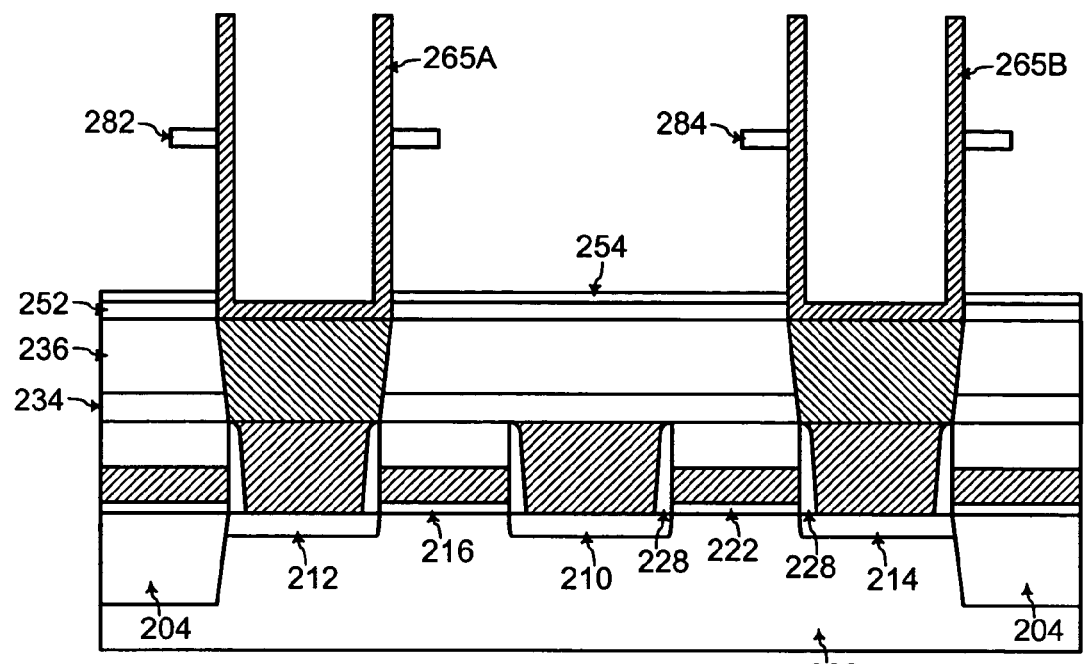
Figure 21B:
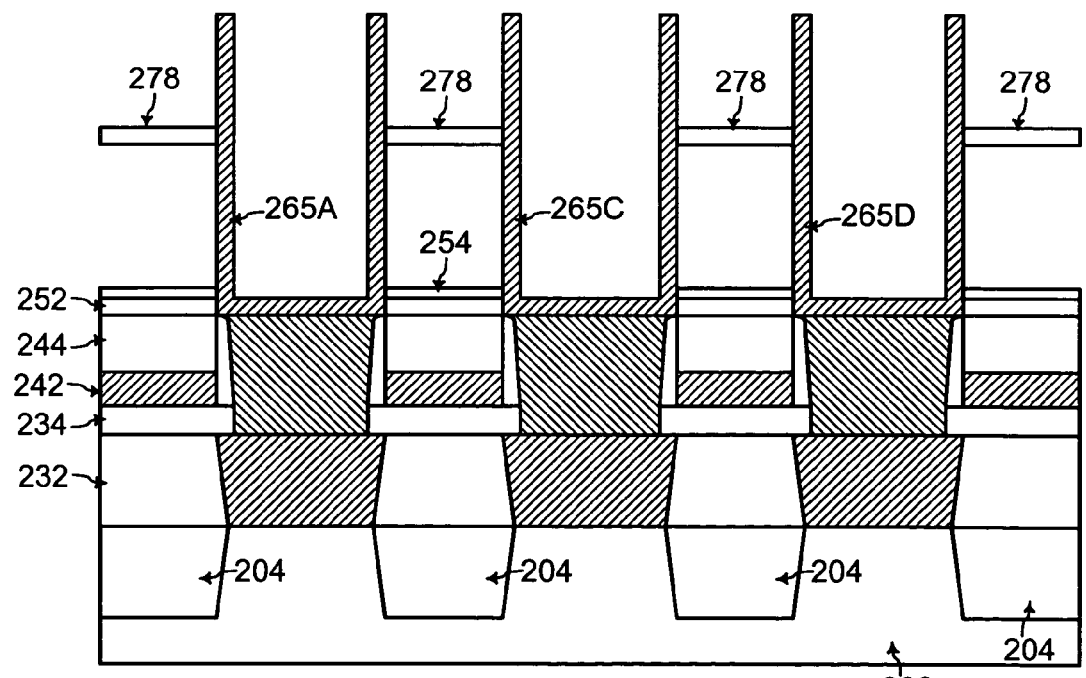

Referring to FIGS. 21A and 21B after FIGS. 20A and 20B, the masking spacers 274, the mask structures 276, the first mold layer 256, and the sacrificial dielectric 266 are etched away. The fifth ILD layer 254 acts as an etch stop layer during etching away of the first mold layer 256 such that the fourth and fifth ILD layers 252 and 254 remain to surround the bottom of the first electrodes 265A, 265B, 265C, and 265D.

Figure 22:
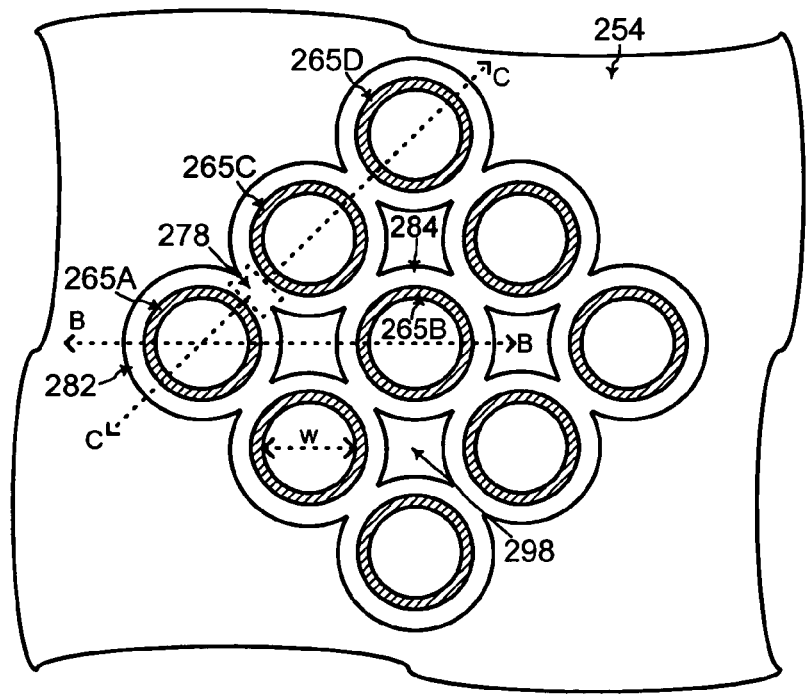
FIG. 22 shows a top view of the support structures including circular discs surrounding the first electrodes after FIGS. 21A and 21B, according to an embodiment of the present invention.

FIG. 22 shows a top view of the first electrodes 265A, 265B, 265C, and 265D in FIGS. 21A and 21B. Referring to FIGS. 21A, 21B, and 22, each of the first electrodes has a respective circular disc (comprised of the support material 258) surrounding the outside of the first electrode. For example, a first circular disc 282 surrounds the outside of the first electrode 265A, and a second circular disc 284 surrounds the outside of the second electrode 265B, in FIGS. 21A and 22. In addition, a joining portion 278 (comprised of the support material 258) is formed between each of two nearest adjacent first electrodes. For example, a joining portion 278 is formed between the two nearest adjacent first electrodes 265A and 265C in FIGS. 21B and 22.

Figure 23A:
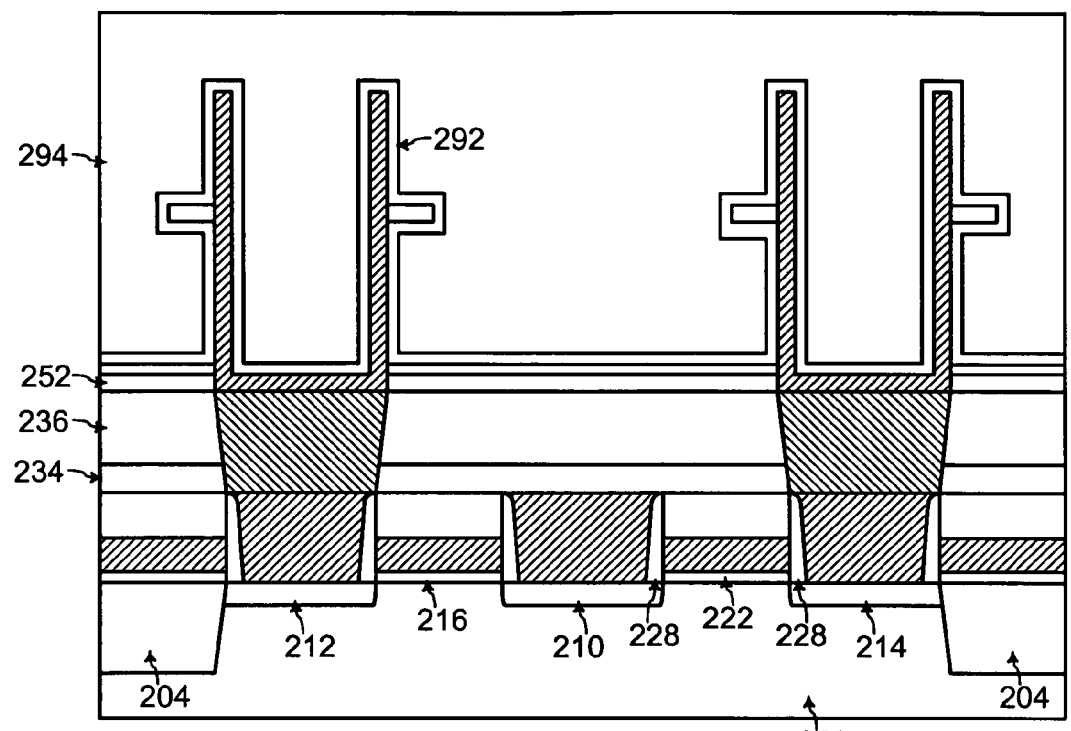
Figure 23B:
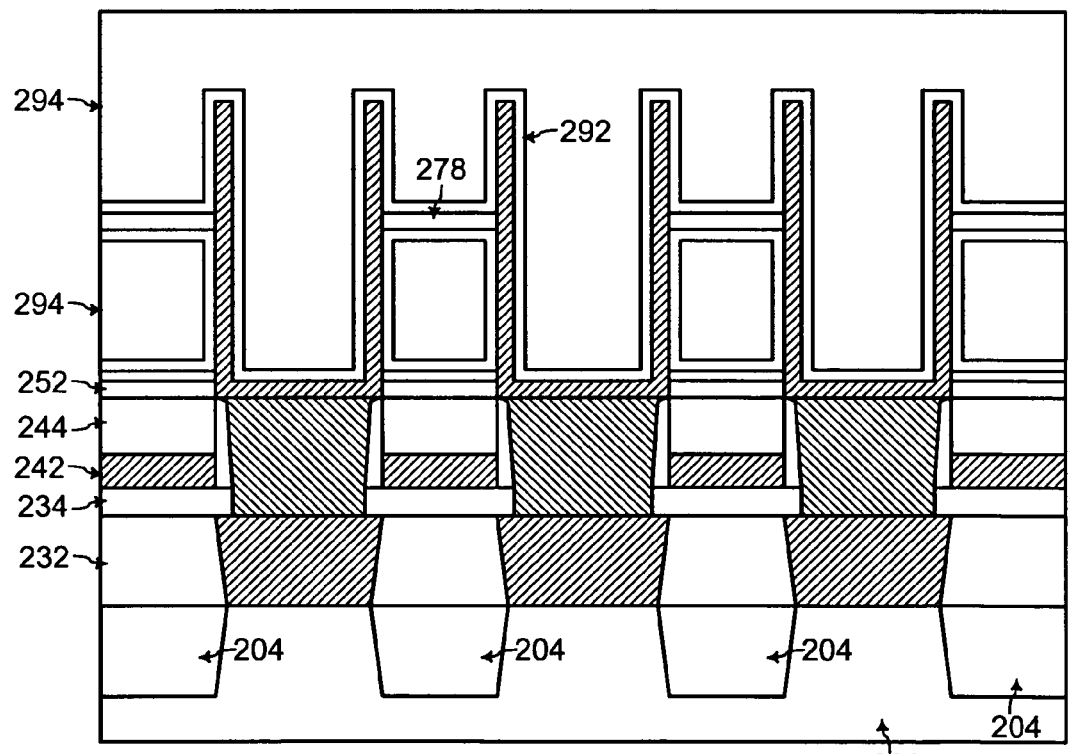

Referring to FIGS. 23A and 23B after FIGS. 21A and 21B, a capacitor dielectric 292 is deposited onto exposed surfaces of the first electrodes, the support structures comprised of the remaining support material 258, and the fifth ILD layer 254. The capacitor dielectric 292 is comprised of a dielectric material having a dielectric constant that is higher than that of silicon dioxide ($SiO_2$), such as a metal oxide for example, in an example embodiment of the present invention. Thereafter, a material for a second electrode 294 of the stacked capacitors is deposited onto the capacitor dielectric 292. The second electrode 294 is comprised of polysilicon, in an example embodiment of the present invention.

Figure 1:
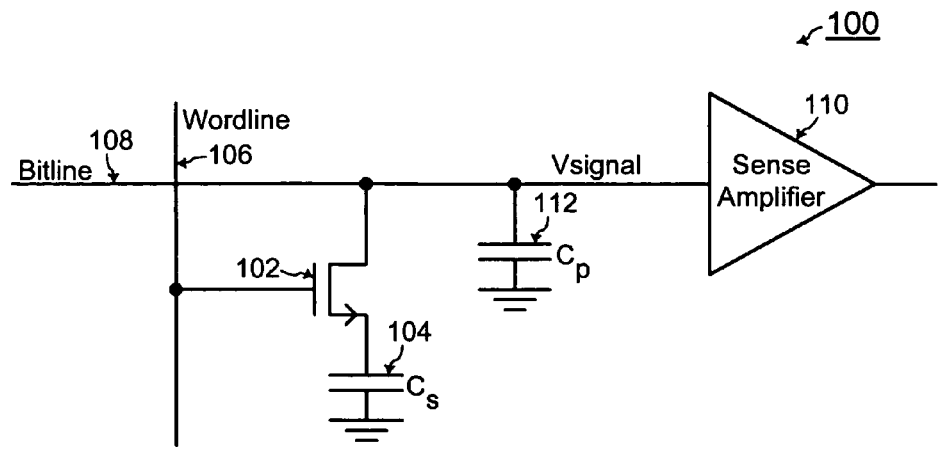
FIG. 1 shows a simplified schematic of a DRAM (dynamic random access memory) cell, according to the prior art.
Figure 2:
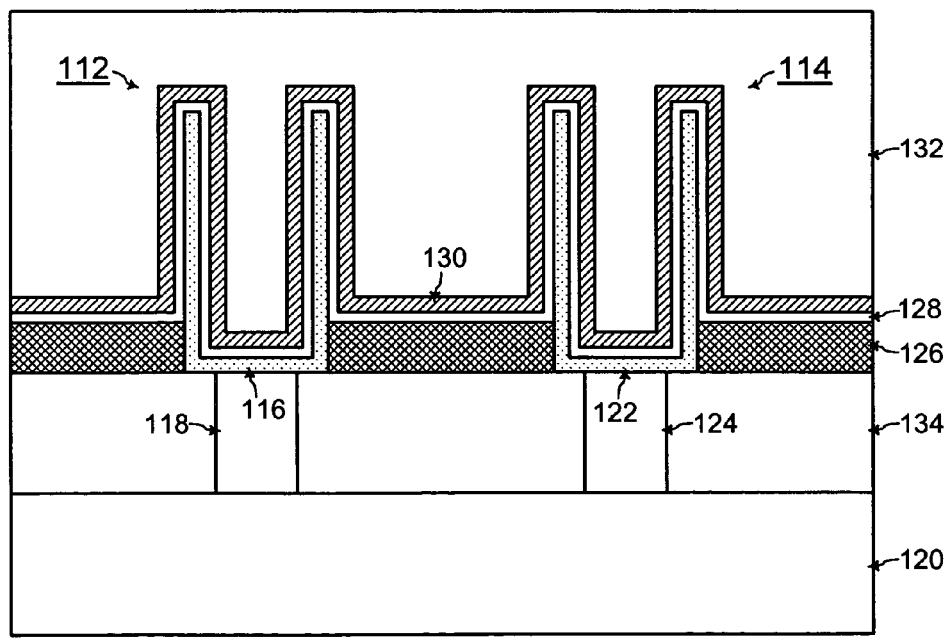
FIG. 2 shows a cross-sectional view of stacked capacitors used for DRAM with just a mount material surrounding a bottom of the stacked capacitors, according to the prior art.
Figure 3:
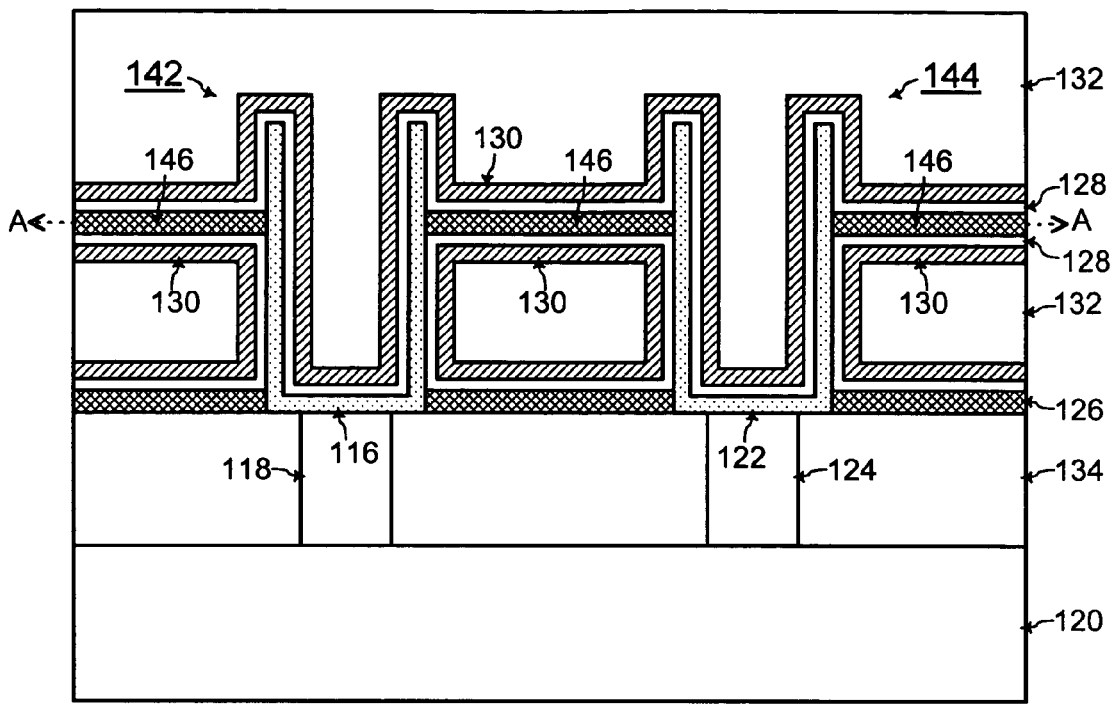
FIG. 3 shows a cross-sectional view of stacked capacitors with support beams disposed between adjacent stacked capacitors for preventing leaning of first electrodes of such capacitors, according to the prior art.
Figure 4:
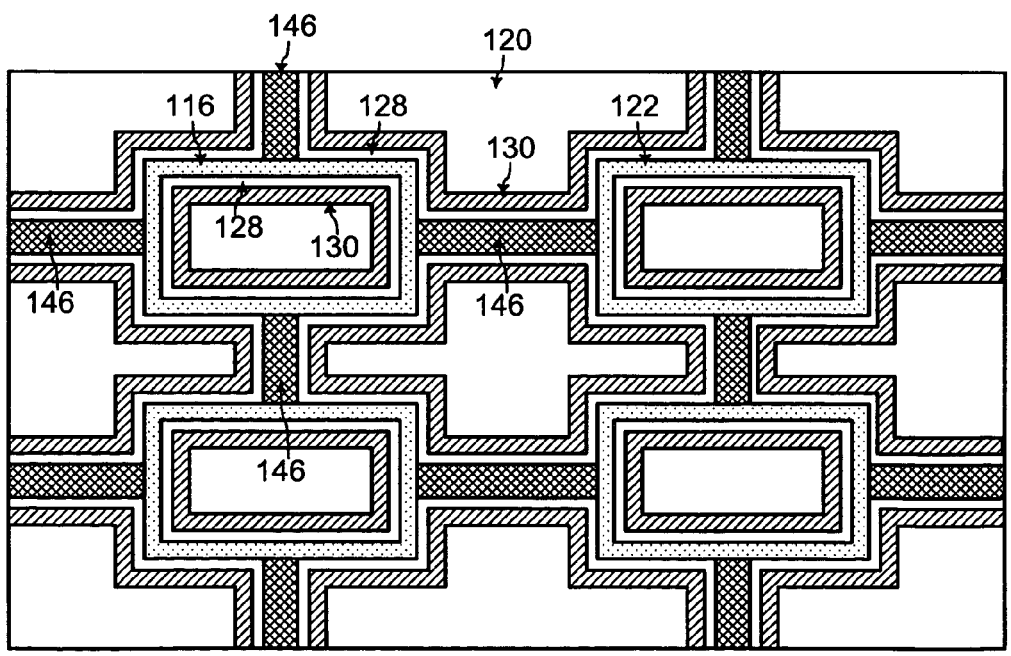
FIG. 4 shows a cross-sectional view across line A—A of FIG. 3, according to the prior art.
Figure 5:
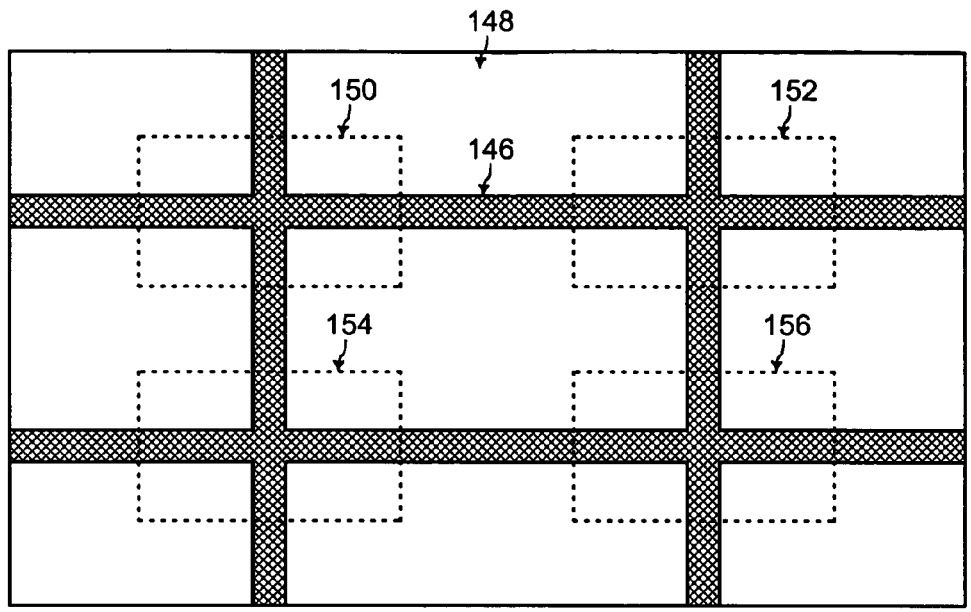
FIGS. 5, 6, and 7 show the cross-sectional view of FIG. 4 during fabrication of the supports beams and the first electrodes of the stacked capacitors, according to the prior art.
Figure 6:
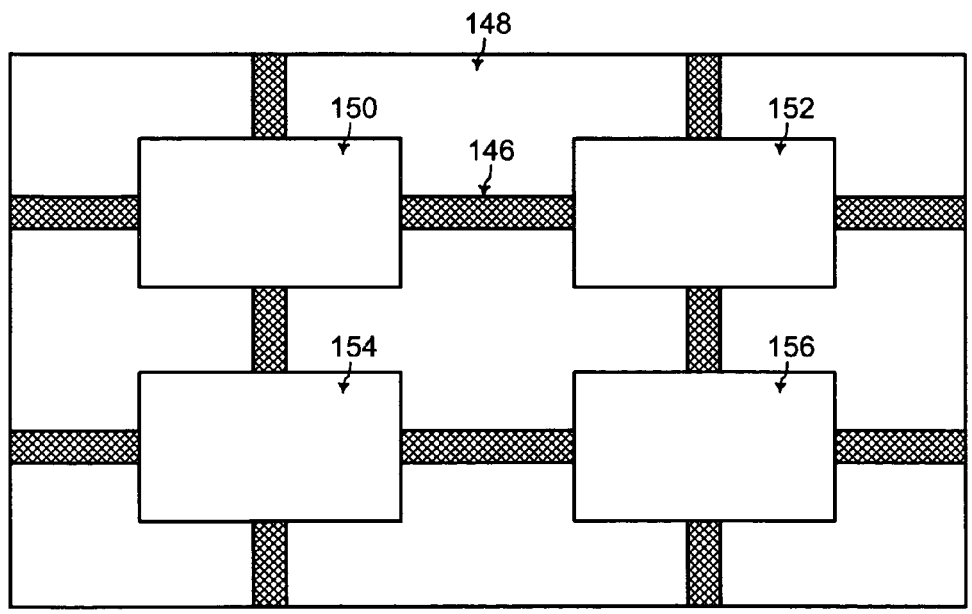
Figure 7:
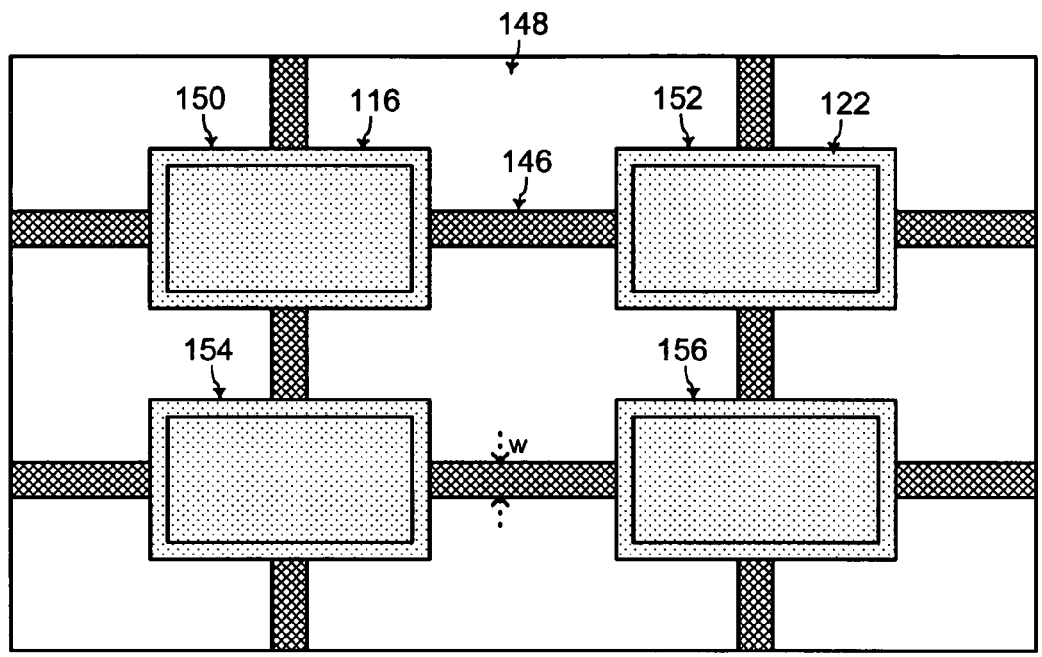

Accordingly, each stacked capacitor formed according to the present invention is comprised of a respective one of the first electrodes (such as 265A, 265B, 265C, or 265D for example), the capacitor dielectric 292, and the common second electrode 294. Referring to FIG. 22, the stacked capacitors are formed in an array configuration in an example embodiment of the present application. In one example application of such stacked capacitors, referring to FIGS. 1, 23A, and 23B, each of such first electrodes is coupled via the conductive plugs 240 and 230 to a source junction of a corresponding switching transistor. Thus, each of such first electrodes may be applied as a storage node of a storage capacitor for a DRAM cell. Furthermore, the second electrode 294 is a common electrode that may be coupled to the ground node within the DRAM cell.

Capacitance of such stacked capacitors of the present invention may be maximized with a relatively high height of such first electrodes. Referring to FIG. 22, the circular discs (comprised of the remaining support material 258) surrounding each of the first electrodes 265A, 265B, 265C, and 265D forms support structures that prevent such first electrodes from leaning towards each-other. In addition, a joining portion 278 is disposed between any two nearest adjacent first electrodes to prevent such closely disposed first electrodes from leaning towards each-other.

Thus, the first electrodes 265A, 265B, 265C, and 265D may be formed to be vertically high without leaning against each-other, to effectively increase the area and thus the capacitance of the stacked capacitors. For example, the fourth ILD layer 252, the fifth ILD layer 254, the first mold layer 256, the layer of support material 258, and the second mold layer 260 are deposited to have thicknesses of 700 Å (angstroms), 500 Å, 20,000 Å, 1,000 Å, and 5,000–10,000 Å, respectively, in an example embodiment of the present invention.

Furthermore, the fourth and fifth ILD layers 252 and 254 comprise mount materials surrounding the bottom of the first electrodes 265A, 265B, 265C, and 265D. Such mount materials 252 and 254 provide further support such that the first electrodes 265A, 265B, 265C, and 265D remain vertically standing and separated from each-other.

For further maximizing capacitance, the area of overlap between a first electrode and the second electrode 292 is desired to be maximized. The support structures comprised of the remaining support material 258 are disposed at a level between the mounting materials 252 and 254 and the top of the first electrodes. Thus, the thickness of the mounting materials 252 and 254 may be minimized without the first electrodes leaning against each-other, for further maximizing capacitance.

Figure 24:
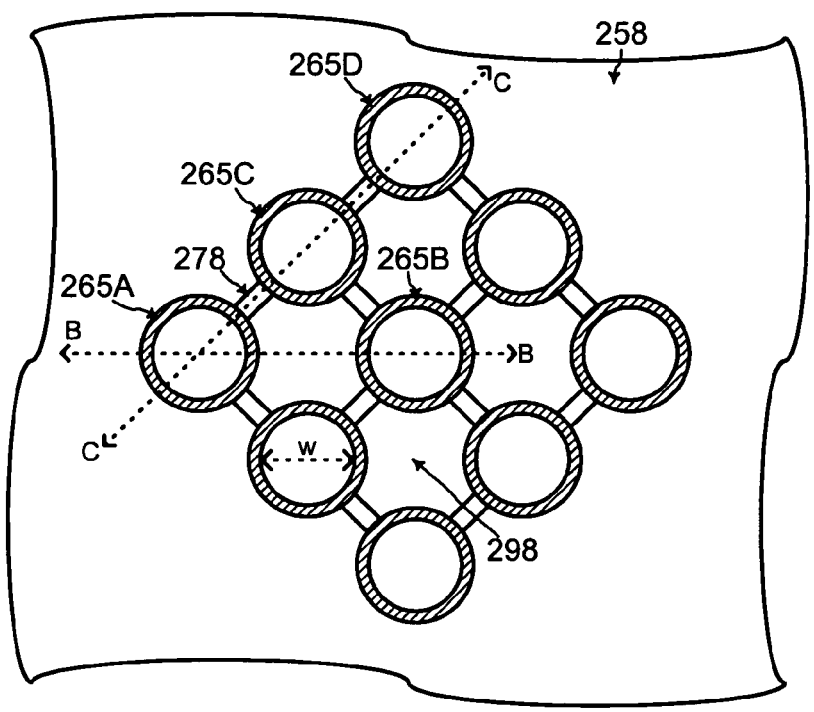
FIG. 24 shows a top view of the support structures comprising support beams disposed between adjacent first electrodes after further etching of the circular discs of FIG. 22, according to another embodiment of the present invention.

FIG. 24 illustrates another embodiment of the present invention for further increasing capacitance of the stacked capacitors. Referring to FIGS. 22 and 24, note that at least one further etching step is performed to increase the area of any opening 298 disposed between four nearest first electrodes. Such further etching may occur during subsequent fabrication steps for forming other structures of the DRAM. Alternatively, a subsequent etch step may be intentionally added for increasing the area of the openings 298.

In any case, with such further etching, the circular discs surrounding the first electrodes are etched away while each of the joining portions 278 turns into a joining beam 278 between two nearest adjacent first electrodes, as illustrated in FIG. 24. With etching away of the circular discs of the insulating material 258, the sidewalls of the first electrodes are further exposed.

Figure 25:
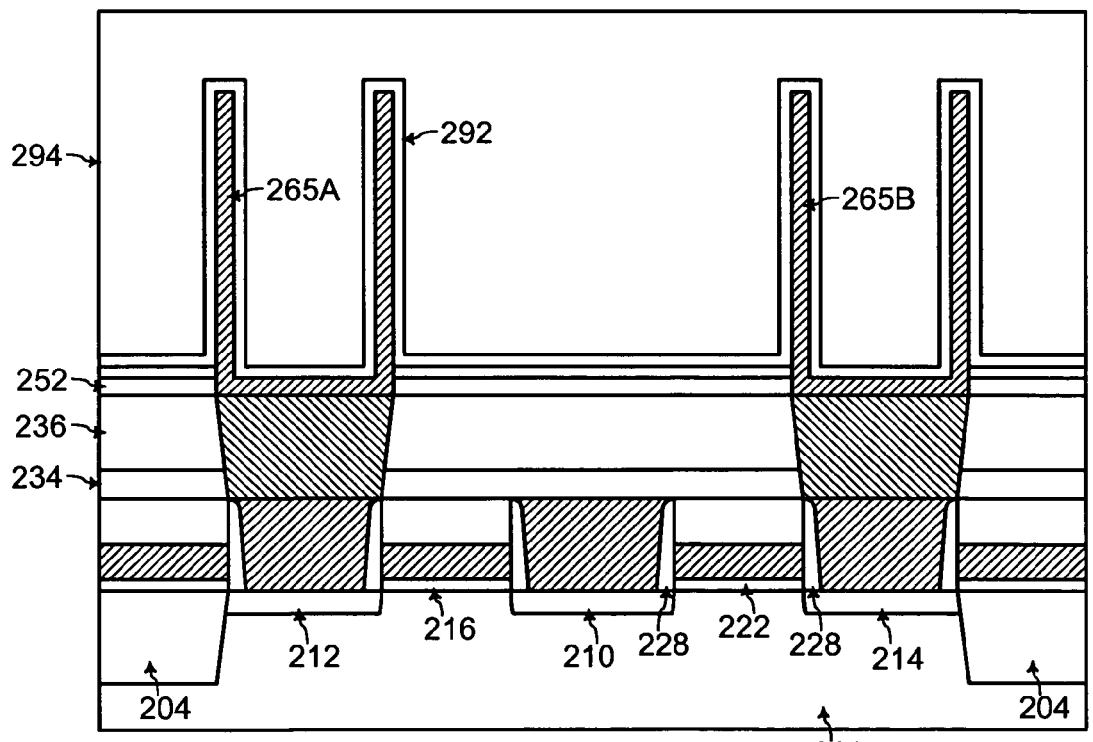
FIG. 25 shows the cross-sectional view similar to FIG. 23A but without the circular discs surrounding the first electrodes, according to the embodiment of FIG. 24.

Comparing FIGS. 23A and 25, the circular discs 282 and 284 no longer exist in the B—B direction of FIG. 25, thus further increasing the area of overlap between the second electrode 294 and the first electrodes 265A and 265B. Such increased area of overlap advantageously results in increased capacitance of the stacked capacitors. In addition, referring to FIGS. 23B and 24, the joining beams 278 still remain between two nearest adjacent first electrodes (such as between 265A and 265C in the C—C direction of FIG. 24) to prevent leaning of the first electrodes.

FIGS. 27A, 28A, 29A, 30A, and 31A show cross-sectional views along the B—B direction of FIG. 8 for fabrication of the stacked capacitors according to another embodiment of the present invention. FIGS. 27B, 28B, 29B, 30B, and 31B show cross-sectional views along the C—C direction of FIG. 8 for fabrication of stacked capacitors, according to such an alternative embodiment of the present invention.

Figure 26A:
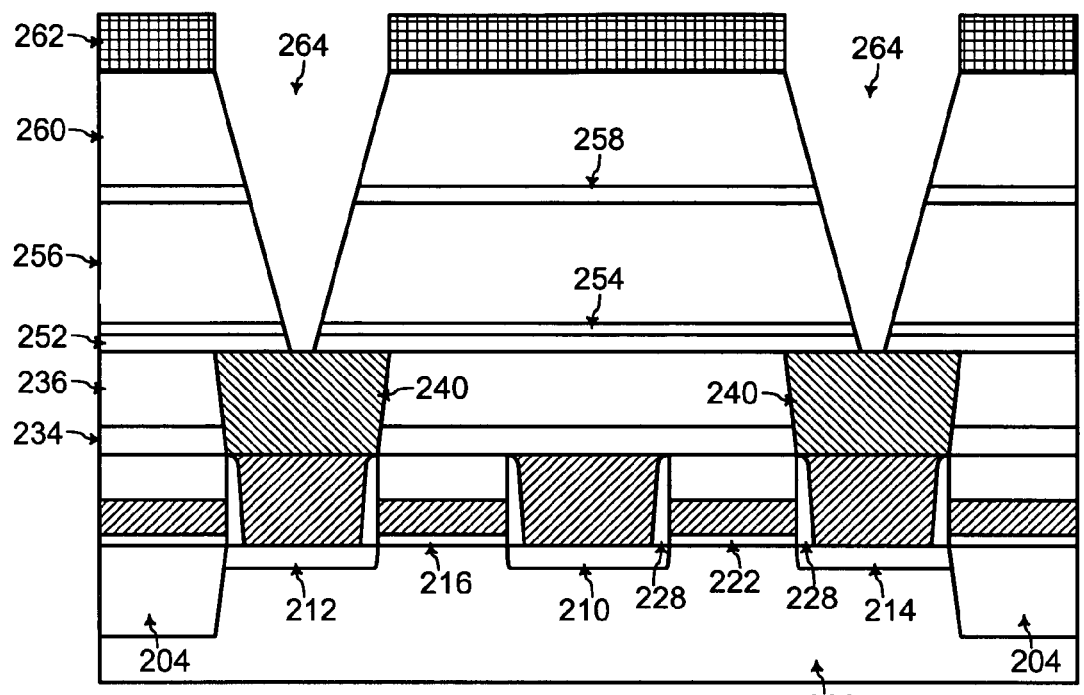
FIGS. 26A, 27A, 28A, 29A, 30A, and 31A show cross-sectional views along the B—B direction of FIG. 8 for illustrating fabrication of stacked capacitors, with openings formed through mold layers having different etch rates according to another embodiment of the present invention.
Figure 26B:
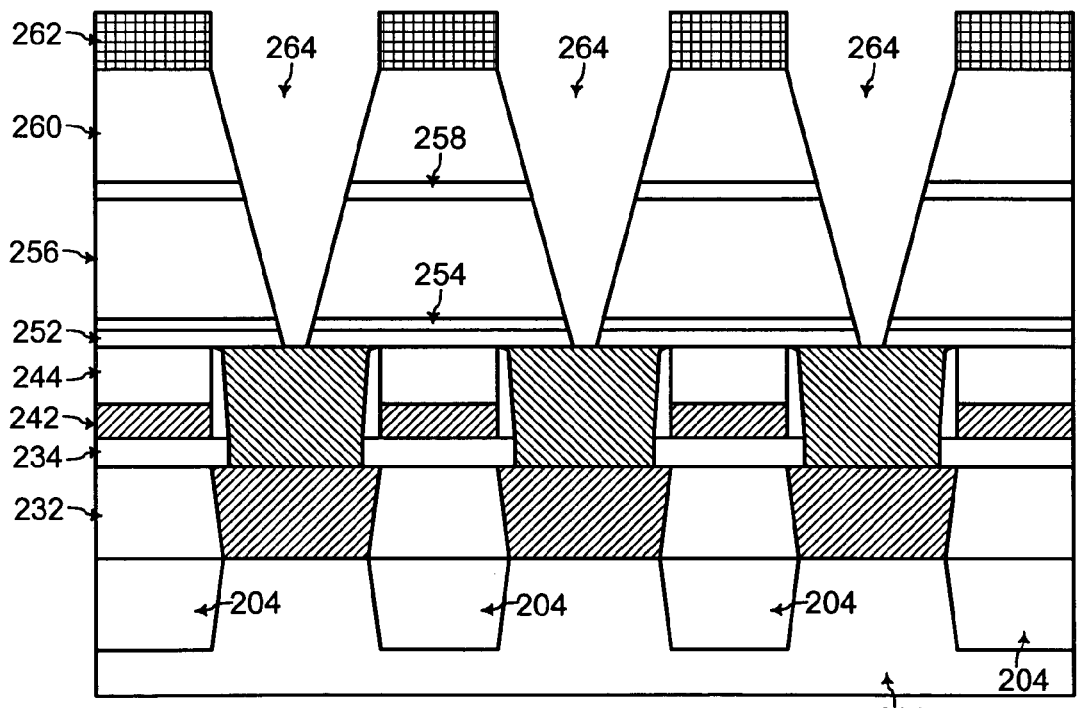
FIGS. 26B, 27B, 28B, 29B, 30B, and 31B show cross-sectional views along the C—C direction of FIG. 8 for illustrating fabrication of stacked capacitors, with openings formed through mold layers having different etch rates according to the alternative embodiment of the present invention.

Comparing FIG. 13A with FIG. 26A and comparing FIG. 13B with FIG. 26B, the perfectly vertical sidewalls of the openings 264 in FIGS. 13A and 13B are for the ideal situation. However, in reality, because of the high aspect ratio of the openings 264, the openings 264 become narrower toward the bottom of the openings 264, as illustrated in FIGS. 26A and 26B. Such narrowed openings 264 are disadvantageously more prone to leaning, and the first electrodes formed within such narrowed openings having less area of contact with the underlying contact plugs 240.

Figure 27A:
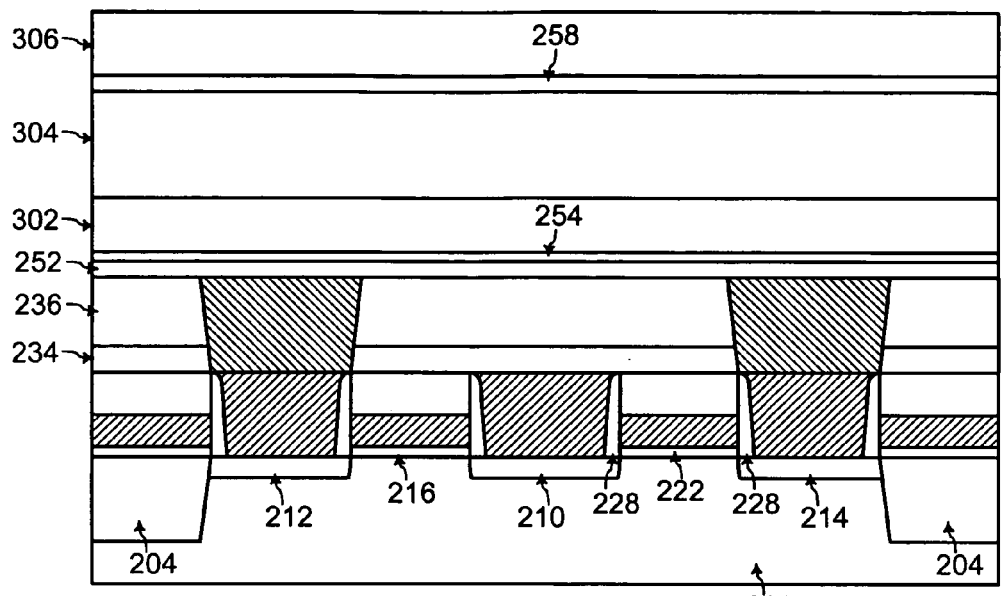
Figure 27B:
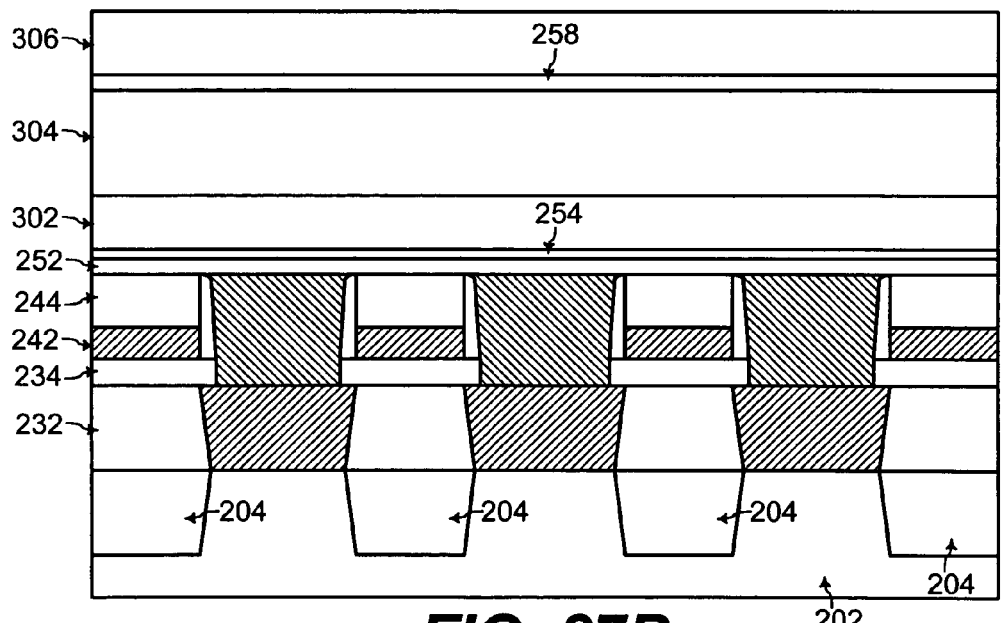

To address such disadvantages, referring to FIGS. 27A and 27B, after the fourth and fifth ILD layers 252 and 254 are deposited, a first mold layer 302 is deposited on the fifth ILD layer 254. Thereafter, a second mold layer 304 is deposited on the first mold layer 302, and the layer of support material 258 is deposited on the second mold layer 304. In addition, a third mold layer 306 is deposited on the layer of support material 258.

The fourth and fifth ILD layers 252 and 254 and the layer of support material 258 in FIGS. 27A and 27B are similar as that of FIGS. 12A and 12B. The first mold layer 302 is comprised of BPSG (borophosphosilicate glass), the second mold layer 304 is comprised of PTEOS (phosphorous doped tetraethylorthosilicate) based oxide, and the third mold layer 306 is comprised of PTEOS (phosphorous doped tetraethylorthosilicate) based oxide, in an example embodiment of the present invention. The first, second, and third mold layers 302, 304, and 306 are deposited with thicknesses of 7,000 Å (angstroms), 13,000 Å, and 5,000 Å, respectively, in an example embodiment of the present invention.

Figure 28A:
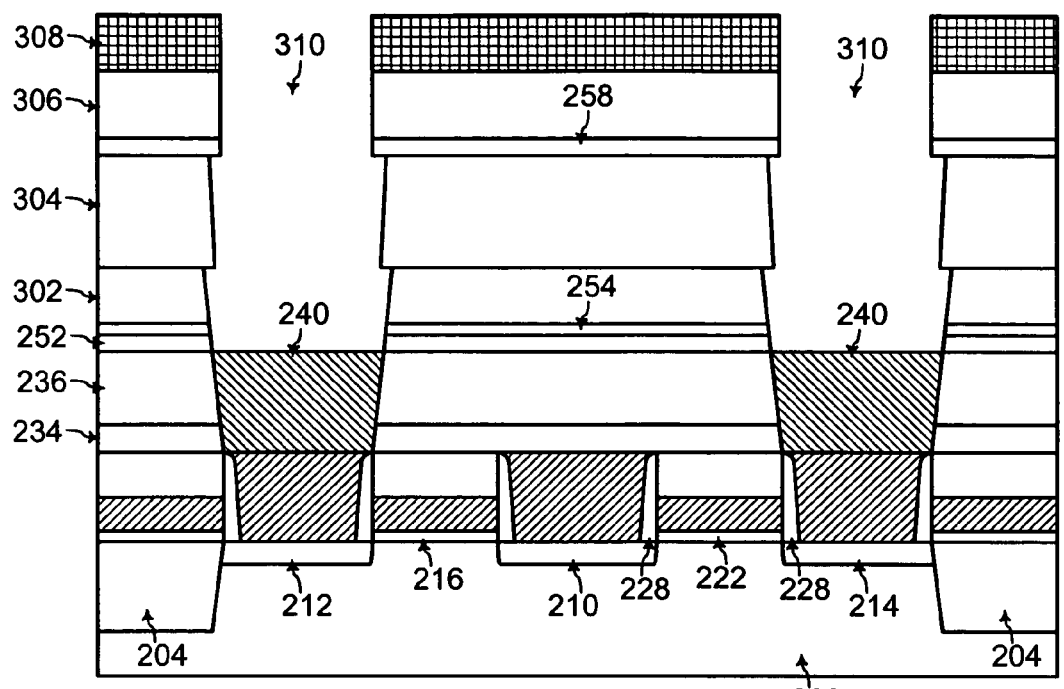
Figure 28B:
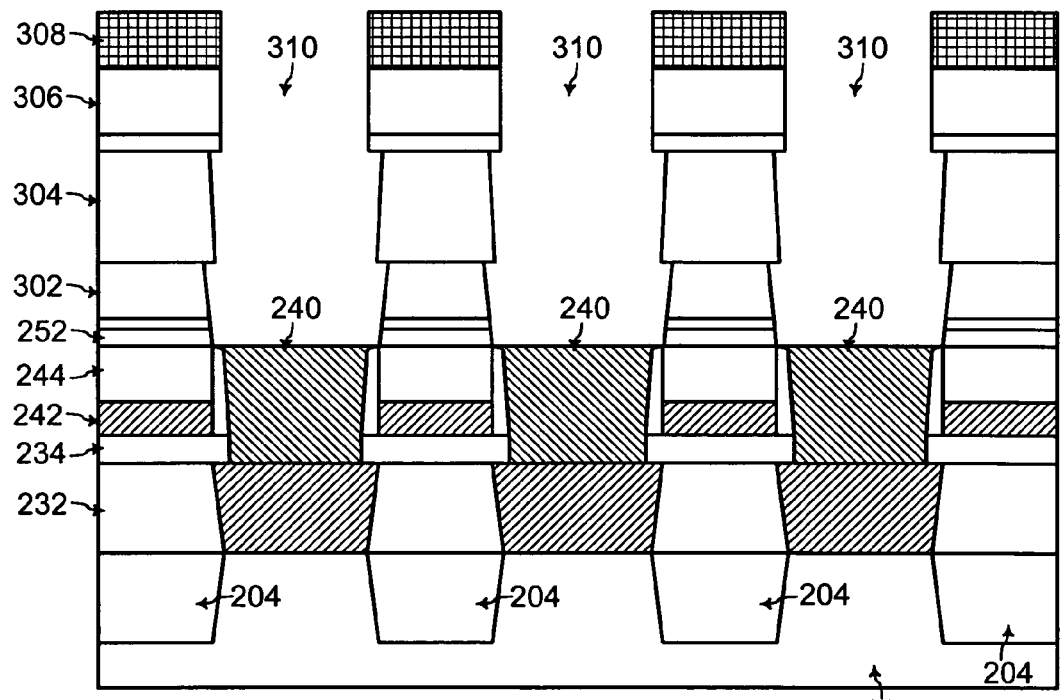

Referring to FIGS. 28A and 28B after FIGS. 27A and 27B, a photo-resist layer 308 is patterned for forming a plurality of openings 310 through the layers of materials 252, 254, 256, 302, 304, 258, and 306. The photo-resist layer 308 is deposited and patterned on the third mold layer 306. Each of the openings 310 is formed over one of the second conductive plugs 240 that become exposed through the openings 310.

In the embodiment of the present invention, the bottom first mold layer 302 has a higher etch rate than the upper second mold layer 304 in an etch process for etching the first and second mold layers 302 and 304 when forming the openings 310. Because the bottom first mold layer 302 etches away faster in such an etch process, the openings 310 do not narrow significantly toward the bottom of the openings 310.

Figure 29A:
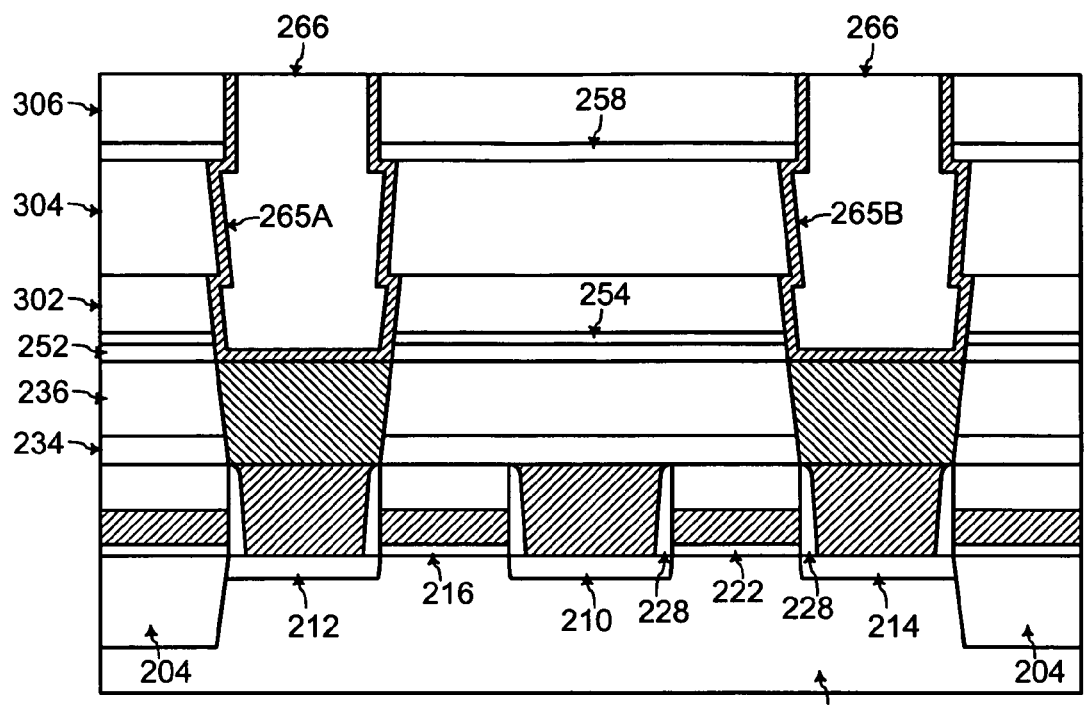
Figure 29B:
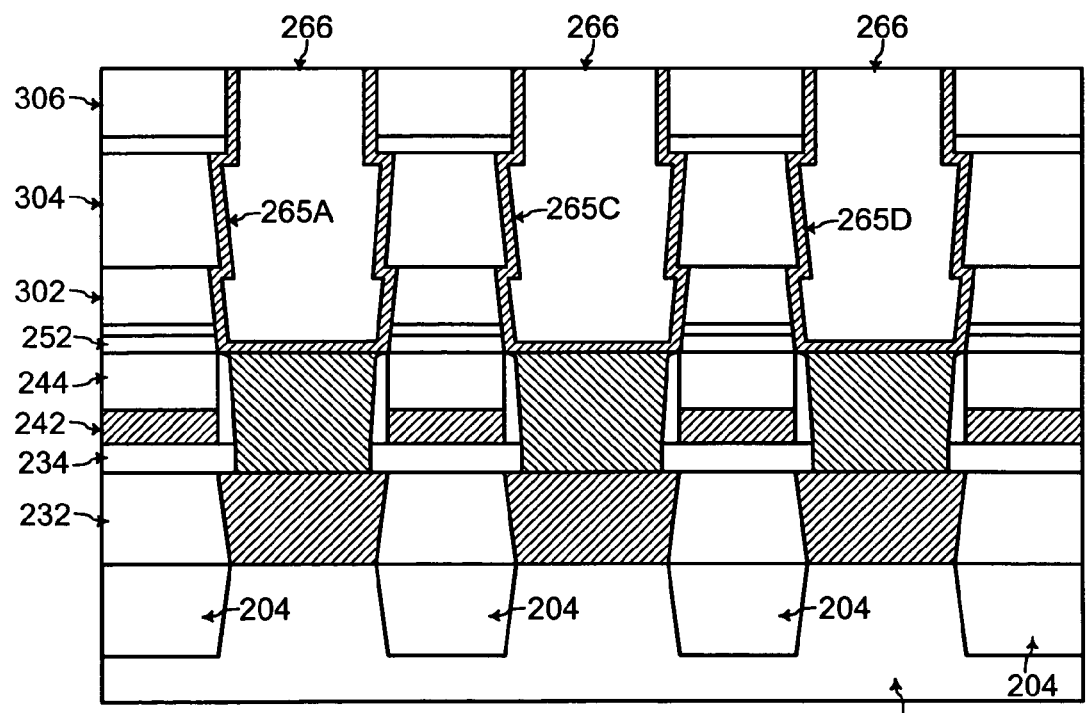
Figure 30A:
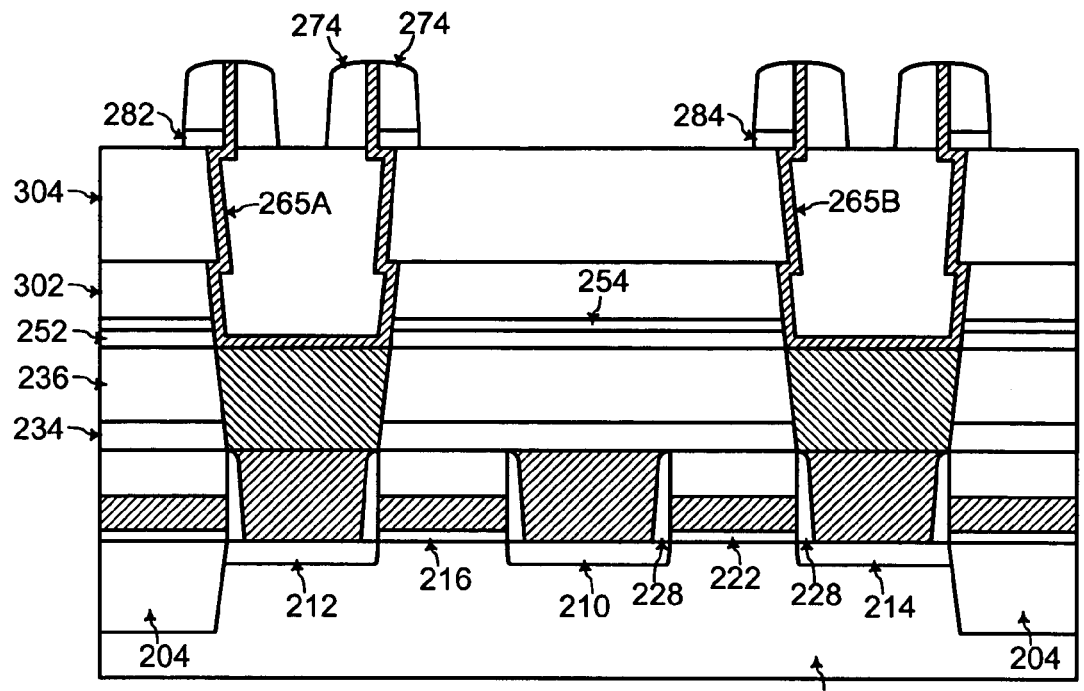
Figure 30B:
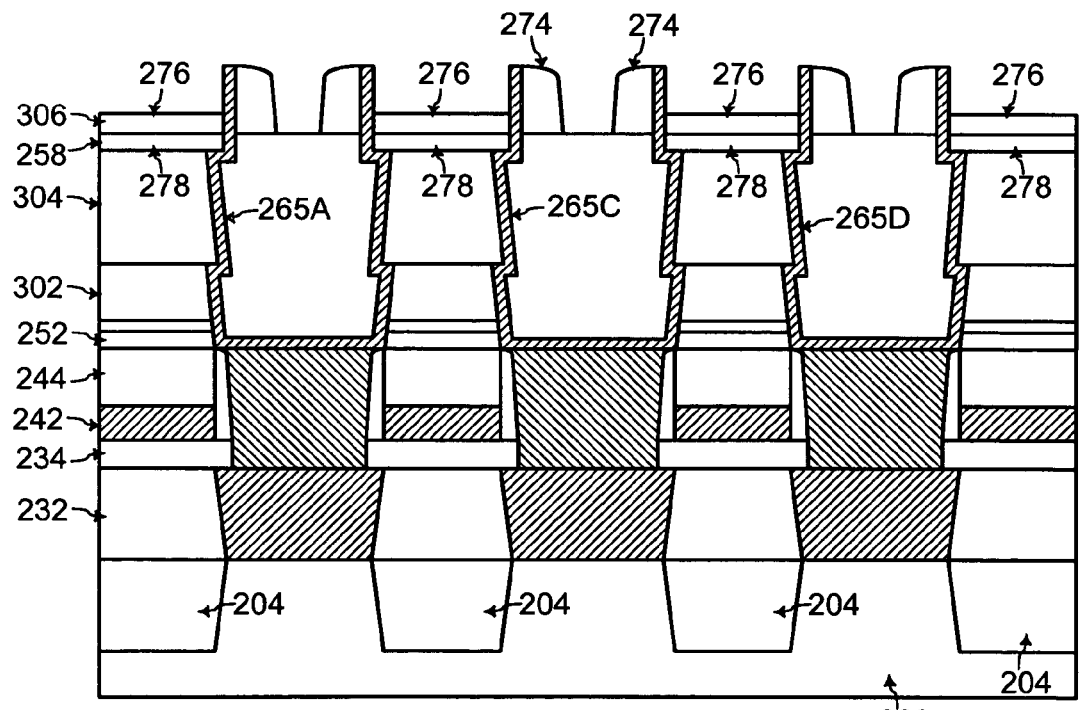

Referring to FIGS. 29A and 29B after FIGS. 28A and 28B, the first electrodes 265A, 265B, 265C, and 265D are formed on the walls of the openings, similar to FIGS. 15A and 15B. Referring to FIGS. 30A and 30B after FIGS. 29A and 29B, the masking spacers 274 and the mask structures 276 comprised of a mask material are formed, similar to FIGS. 19A and 19B. In addition, any portion of the support material 258 that is not covered under the masking spacers 274 or the mask structures 276 is etched away to form the support structures comprised of the remaining support material 258, similar to FIGS. 20A and 20B.

Figure 31A:
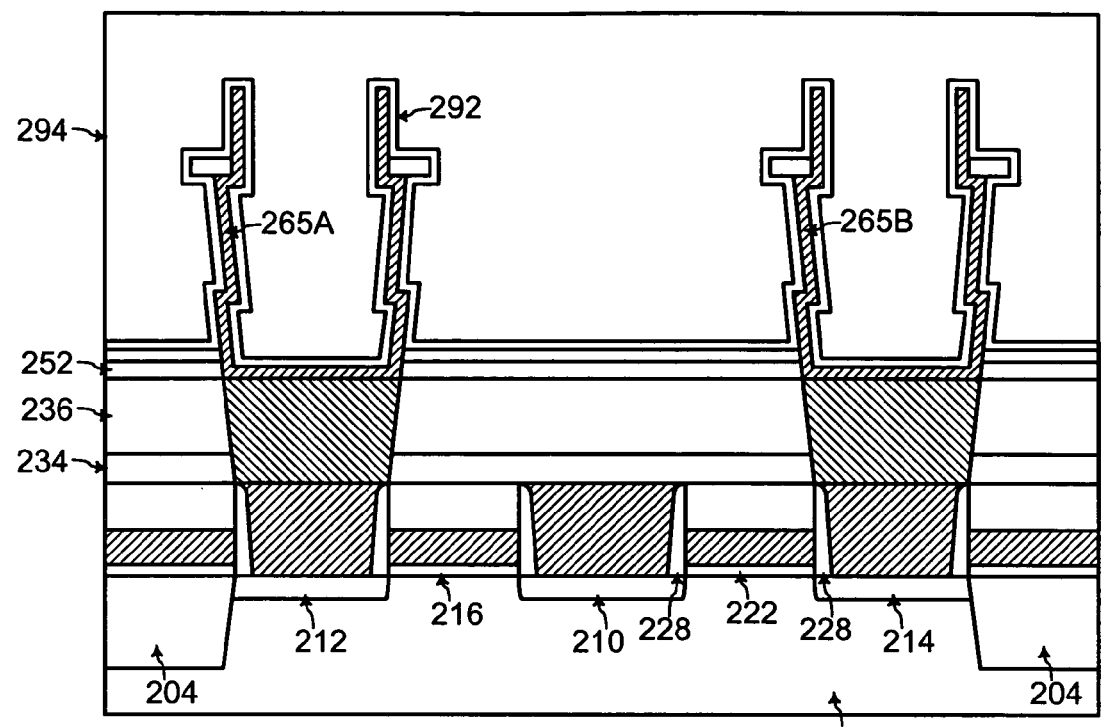
Figure 31B:
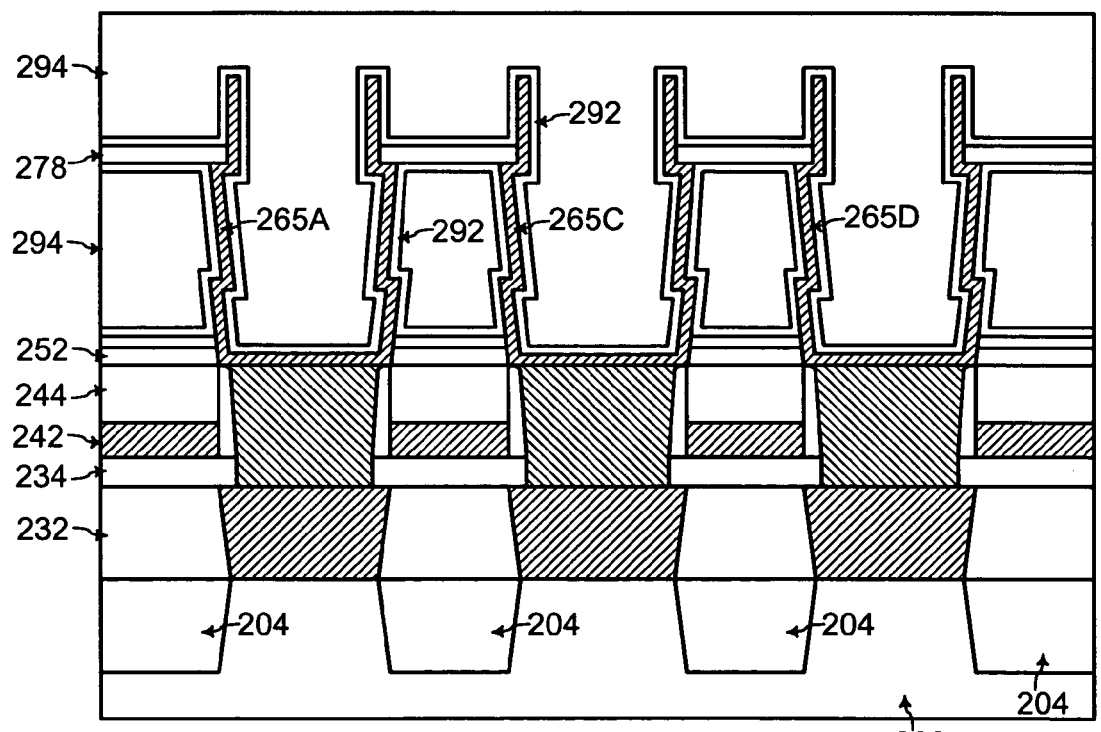

Referring to FIGS. 31A and 31B after FIGS. 30A and 30B, the masking spacers 274, the mask structures 276, the first and second mold layers 302 and 304, and the sacrificial dielectric 266 are etched away, similar to FIGS. 21A and 21B. Thereafter, the capacitor dielectric 292 and the second electrode 294 are formed onto exposed surfaces of the first electrodes, the support structures comprised of the remaining support material 258, and the fifth ILD layer 254, similar to FIGS. 23A and 23B.

Figure 32:
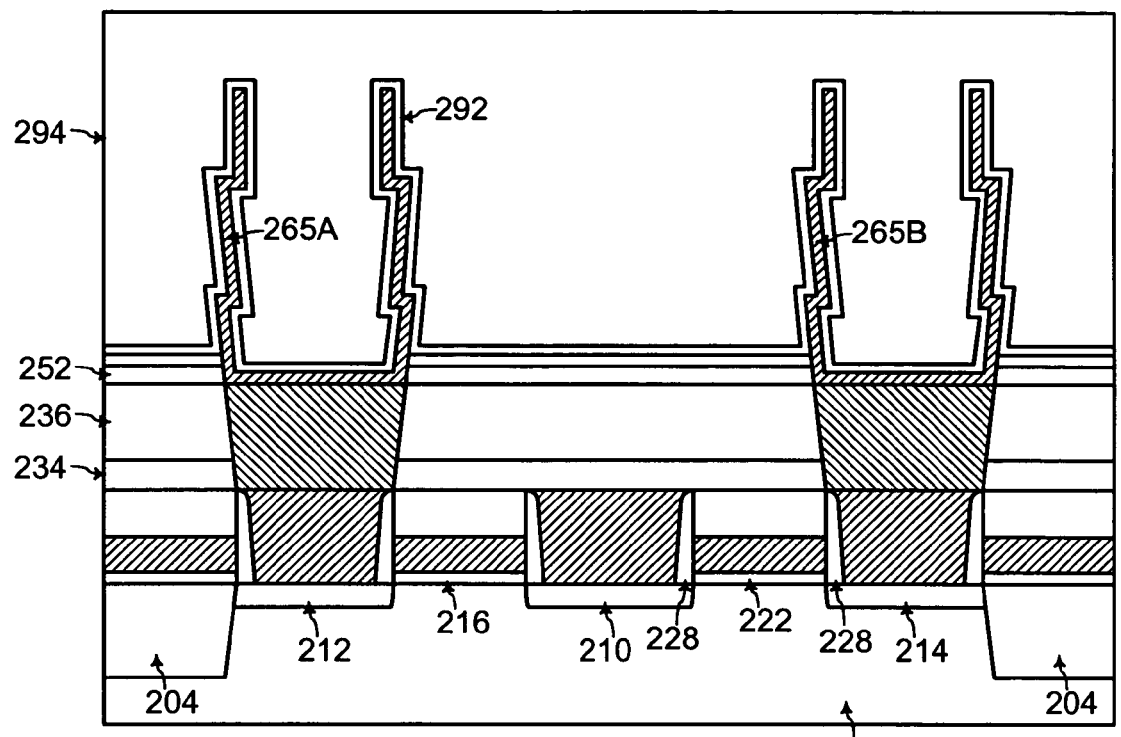
FIG. 32 shows the cross-sectional view similar to FIG. 31A but with the circular discs surrounding the first electrodes etched away after FIG. 30A.

Comparing FIG. 32 to FIG. 31, the circular discs around each of the first electrodes is etched away such that just the support beams 278 remain, similar to FIGS. 24 and 25. Thus, the circular discs 282 and 284 are no longer present around the first electrodes 265A and 265B along the B—B direction in FIG. 32. Similar to FIG. 24, the support beams 278 are still present in the C—C direction between any two nearest adjacent first electrodes as illustrated in FIG. 31B to prevent leaning of the first electrodes towards each-other.

The foregoing is by way of example only and is not intended to be limiting. For example, the array of stacked capacitors is illustrated and described herein as being applied for storage capacitors of a DRAM. However, the array of stacked capacitors fabricated according to the present invention may be applied for any other application requiring maximized capacitance of highly integrated capacitors. In addition, any dimension, number, and material specified or illustrated herein is by way of example only.

Furthermore, any shape described or illustrated herein is by way of example only. For example, circular discs 282 and 284 of the remaining support material 258 are described and illustrated herein as being formed around the circular first electrodes 265A, 265B, 265C, and 265D. However, discs of the remaining support material 258 may also be rectangular if the first electrodes were formed to have a rectangular cross-section.

Additionally, it is to be understood that terms and phrases such as "on" and "bottom" as used herein refer to relative location and orientation of various portions of the structures with respect to one another, and are not intended to suggest that any particular absolute orientation with respect to external objects is necessary or required. For example, when one layer of material is stated to be deposited "on" another layer of material, the present invention may be practiced when an intervening layer of material is also present between such layers of materials.

The present invention is limited only as defined in the following claims and equivalents thereof.

The invention claimed is:

1. A method of fabricating capacitors, comprising:
A. forming openings through layers of materials including a layer of support material displaced from a bottom of the openings;
B. forming a respective first electrode for a respective capacitor within each of the openings, after the step A; and
C. patterning the layer of support material to form support structures around the first electrodes, after the step B.

2. The method of claim 1, wherein step C includes:
etching away at least one of the layers of materials toward the top of the first electrodes such that a top portion of the first electrodes is exposed and such that the support material is exposed;
forming masking spacers with a masking material around the exposed top portion of the first electrodes with a mask structure of the masking material remaining on joining portions of the support material; and
etching away exposed portions of the support material such that the support structures including the joining portions remain,
wherein each joining portion is disposed between the first electrodes of adjacent capacitors.

3. The method of claim 2, further including:
depositing the masking material having a thickness that is greater than ½ of a length of the joining portions, before forming the masking spacers.

4. The method of claim 1, wherein the support structures include a respective disc surrounding each first electrode.

5. The method of claim 4, wherein the respective disc is a circular disc.

6. The method of claim 4, further comprising:
performing a further etching process to etch away the respective disc surrounding each first electrode such that a respective beam remains as the support structures.

7. The method of claim 1, wherein the layers of materials include a layer of mount material surrounding the openings toward the bottom of the openings.

8. The method of claim 7, wherein the support structures are disposed between the mount material and the top of the first electrodes.

9. The method of claim 7, further comprising for each capacitor:
etching away the layers of materials except the support structures down to the mount material;
forming a capacitor dielectric on exposed surfaces of the first electrode; and
forming a second electrode on exposed surfaces of the capacitor dielectric.

10. The method of claim 7, wherein the support material and the mount material are comprised of silicon nitride.

11. The method of claim 1, wherein the support material is comprised of silicon nitride.

12. The method of claim 1, wherein step A includes:
forming the openings through a plurality of mold layers, with a respective etch rate of each mold layer successively increasing toward a bottom of the openings.

13. The method of claim 1, wherein each of the openings is formed onto a respective conductive plug coupled to a junction of a respective switching transistor.

14. The method of claim 13, wherein the capacitors form an array for a DRAM (dynamic random access memory).

15. The method of claim 14, wherein the first electrode is a storage node for each capacitor.

16. A method of fabricating capacitors, comprising:
A. forming openings through layers of materials including a layer of support material displaced from a bottom of the openings;
B. forming a respective first electrode for a respective capacitor within each of the openings; and
C. patterning the layer of support material to form support structures including a respective disc surrounding each first electrode.

17. The method of claim 16, wherein step C includes:
etching away at least one of the layers of materials toward the top of the first electrodes such that a top portion of the first electrodes is exposed and such that the support material is exposed;
forming masking spacers with a masking material around the exposed top portion of the first electrodes with a mask structure of the masking material remaining on joining portions of the support material; and etching away exposed portions of the support material such that the support structures including the joining portions remain, wherein each joining portion is disposed between the first electrodes of adjacent capacitors.

18. The method of claim 17, further including:

depositing the masking material having a thickness that is greater than ½ of a length of the joining portions, before forming the masking spacers.

19. The method of claim 17, further comprising:

performing a further etching process to etch away the respective disc surrounding each first electrode such that a respective beam remains for each of the joining portions as the support structures.

20. The method of claim 16, wherein the layers of materials include a layer of mount material surrounding the openings toward the bottom of the openings, and wherein the support structures are disposed between the mount material and the top of the first electrodes.

21. The method of claim 20, further comprising for each capacitor:

etching away the layers of materials except the support structures down to the mount material;

forming a capacitor dielectric on exposed surfaces of the first electrode; and forming a second electrode on exposed surfaces of the capacitor dielectric.

22. The method of claim 20, wherein the support material and the mount material are comprised of silicon nitride.

23. The method of claim 16, wherein step A includes:

forming the openings through a plurality of mold layers, with a respective etch rate of each mold layer successively increasing toward a bottom of the openings.

24. The method of claim 16, wherein each of the openings is formed onto a respective conductive plug coupled to a junction of a respective switching transistor.

25. The method of claim 24, wherein the capacitors form an array for a DRAM (dynamic random access memory).

* * * * *